United States Patent
Stathakis et al.

(10) Patent No.: US 10,236,189 B2
(45) Date of Patent: Mar. 19, 2019

(54) ADHESIVE-BONDED THERMAL INTERFACE STRUCTURES FOR INTEGRATED CIRCUIT COOLING

(71) Applicant: International Business Machines Corporation, Armonk, NY (US)

(72) Inventors: Karl Stathakis, Owatonna, MN (US); Phillip V. Mann, Rochester, MN (US); Mark K. Hoffmeyer, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/796,047

(22) Filed: Oct. 27, 2017

(65) Prior Publication Data

US 2018/0374715 A1    Dec. 27, 2018

Related U.S. Application Data

(63) Continuation of application No. 15/629,171, filed on Jun. 21, 2017.

(51) Int. Cl.
| | |
|---|---|
| *H01L 23/24* | (2006.01) |
| *H01L 21/56* | (2006.01) |
| *H01L 21/76* | (2006.01) |
| *H01L 23/373* | (2006.01) |

(52) U.S. Cl.
CPC .............. *H01L 21/56* (2013.01); *H01L 21/76* (2013.01); *H01L 23/24* (2013.01); *H01L 23/373* (2013.01)

(58) Field of Classification Search
CPC ....... H01L 23/24; H01L 23/373; H01L 21/76; H01L 21/56
USPC ........ 257/706, 707, 712, 713, 717, 721, 675
See application file for complete search history.

(56) References Cited

U.S. PATENT DOCUMENTS

| | | | |
|---|---|---|---|
| 5,800,905 A | 9/1998 | Sheridan et al. | |
| 6,037,659 A | 3/2000 | Weixel | |
| 6,219,241 B1 | 4/2001 | Jones | |
| 6,724,080 B1 | 4/2004 | Ooi et al. | |

(Continued)

FOREIGN PATENT DOCUMENTS

| | | |
|---|---|---|
| JP | 2013115083 A | 6/2013 |
| KR | 20150091886 A | 8/2015 |

OTHER PUBLICATIONS

Hoffmeyer et al., "Thermal Interface Material Structures", U.S. Appl. No. 15/193,186, filed Jun. 27, 2016.

(Continued)

*Primary Examiner* — Alexander Oscar Williams
(74) *Attorney, Agent, or Firm* — Stosch Sabo

(57) ABSTRACT

A heat sink can be attached to a heat-producing electronic device by aligning an adhesive material to a surface of the heat sink, applying the adhesive material to the surface to form an outer perimeter and applying, within the outer perimeter, a thermally conductive material to the surface. The surface of the heat sink and a surface of the heat-producing electronic device can then be aligned, and the heat sink can be assembled to the heat-producing electronic device by bringing the heat-producing electronic device surface into contact with the adhesive material. The heat sink can then be affixed to the heat-producing electronic device by applying a compressive force to the assembly to activate the adhesive material.

20 Claims, 6 Drawing Sheets

(56) References Cited

U.S. PATENT DOCUMENTS

| | | |
|---|---|---|
| 6,831,836 B2 | 12/2004 | Bhatia et al. |
| 6,926,955 B2 | 8/2005 | Jayaraman et al. |
| 7,031,162 B2 | 4/2006 | Arvelo et al. |
| 7,291,396 B2 | 11/2007 | Huang et al. |
| 7,473,618 B1 | 1/2009 | Danovitch et al. |
| 7,544,542 B2 | 6/2009 | Too et al. |
| 7,838,985 B2 | 11/2010 | Chiang et al. |
| 9,041,192 B2 | 5/2015 | Saeidi et al. |
| 9,482,477 B2 | 11/2016 | Starkovich et al. |
| 2005/0174738 A1 | 8/2005 | Lam et al. |
| 2006/0060952 A1 | 3/2006 | Yuan et al. |
| 2006/0118925 A1 | 6/2006 | Macris et al. |
| 2006/0145356 A1 | 7/2006 | Liu et al. |
| 2006/0171123 A1 | 8/2006 | Hornung et al. |
| 2006/0220225 A1 | 10/2006 | Ni et al. |
| 2007/0108595 A1 | 5/2007 | Refai-Ahmed |
| 2007/0155136 A1 | 7/2007 | Chrysler et al. |
| 2008/0212162 A1 | 9/2008 | Ichikawa et al. |
| 2008/0237840 A1 | 10/2008 | Alcoe et al. |
| 2009/0072387 A1 | 3/2009 | Gaynes et al. |
| 2010/0246133 A1 | 9/2010 | Schmidt et al. |
| 2012/0325453 A1* | 12/2012 | Lin ..................... H01L 23/3672 165/185 |
| 2015/0359108 A1 | 12/2015 | Chainer et al. |
| 2016/0233141 A1 | 8/2016 | Hirobe |
| 2016/0324031 A1* | 11/2016 | Fujiwara ............... H01L 23/367 |
| 2017/0003723 A1* | 1/2017 | Jun .......................... G06F 1/203 |
| 2017/0374759 A1 | 12/2017 | Hoffmeyer et al. |

OTHER PUBLICATIONS

Stathakis et al., "Adhesive-Bonded Thermal Interface Structures", U.S. Appl. No. 15/629,171, filed Jun. 21, 2017.

IBM, List of IBM Patents or Patent Applications Treated as Related, Oct. 26, 2017, 2 pages.

Stathakis et al., "Adhesive-Bonded Thermal Interface Structures", U.S. Appl. No. 15/838,629, filed Dec. 12, 2017.

IBM, List of IBM Patents or Patent Applications Treated as Related, Dec. 12, 2017, 2 pages.

Accelerated Examination Support Document, U.S. Appl. No. 15/838,629, filed Dec. 12, 2017, 13 pgs.

* cited by examiner

ADHESIVE-BONDED THERMAL INTERFACE STRUCTURES FOR INTEGRATED CIRCUIT COOLING

BACKGROUND

This application claims priority to U.S. patent application Ser. No. 15/629,171 filed on Jun. 21, 2017 and all the benefits accruing therefrom, the contents of which are herein incorporated by reference.

A thermal interface material (TIM) can be used to enhance heat transfer, through reducing the thermal resistance between an electronic device such as an integrated circuit (IC) and a heat sink. Types of TIMs can include, but are not limited to, thermal greases, adhesives, pads and gap fillers. TIMs can include thermally conductive solids and particulate fillers which can be mixed with a binding agent such as a silicone or polymer compounds. A TIM can enhance thermal conductivity by filling irregularities and air gaps between adjacent, mating surfaces, for example, of the IC and the heat sink, with a thermally conductive material.

A heat sink may be used in computers and electronic systems as a passive heat exchanger, and may act as a reservoir that can absorb an arbitrary amount of heat without significantly changing temperature. Heat sinks may be used in computers, for example, to cool devices such as central processing units (CPUs) and/or graphics processing units (GPUs). Heat dissipation from a heat sink can be accomplished through convection, radiation, or conduction, into an ambient or circulated medium, such as air, water, or a coolant/refrigerant. Heat sinks reach a temperature greater than a cooling medium, in order to transfer heat across a thermal gradient from an electronic device to the medium.

SUMMARY

Embodiments may be directed towards a method for attaching a heat sink to a heat-producing electronic device. One of the heat sink and the heat-producing electronic device may have a first surface, the other of the heat sink and the heat-producing electronic device may have a second surface. The method can include aligning an adhesive material to the first surface and applying the adhesive material to the first surface to form an outer perimeter. The method can also include applying, within the outer perimeter, a thermally conductive material to the first surface, aligning the second surface to the first surface, and assembling the heat sink to the heat-producing electronic device by bringing the second surface into contact with the adhesive material. The method can also include affixing the heat sink to the heat-producing electronic device by applying a compressive force to the heat sink and to the heat-producing electronic device, the compressive force activating the adhesive material.

Embodiments may also be directed towards an apparatus for cooling a heat-producing electronic device. The apparatus can include a heat sink with a first surface having a protrusion extending away from the first surface, the protrusion defining an inner perimeter on the first surface. The apparatus can also include an adhesive material affixed to the first surface and to a second surface of the heat-producing electronic device. The adhesive material can hold the first surface of the heat sink in an adjacent, coplanar orientation to the second surface of the heat-producing electronic device. The adhesive material can define an outer perimeter on the first and second surfaces and form an outer cavity bounded by the outer perimeter, the first surface and the second surface. The apparatus can also include a thermally conductive material contained in an inner cavity enclosed within the outer cavity. The inner cavity can be bounded by the inner perimeter, the first surface and the second surface. The thermally conductive material can be configured to cool the heat-producing electronic device by providing a thermally conductive path between the first surface and the second surface.

Embodiments may also be directed towards an apparatus for cooling a heat-producing electronic device. The apparatus can include a heat sink having a first surface and an adhesive material affixed to the first surface and to a second surface of the heat-producing electronic device. The adhesive material can hold the first surface in an adjacent, coplanar orientation to the second surface. The adhesive material, in an unassembled configuration, can define a perimeter on the first and second surfaces and form a cavity bounded by the perimeter, the first surface and the second surface. The apparatus can also include a thermal interface material (TIM) pad located within the cavity. The TIM pad can be configured to cool the heat-producing electronic device by providing a thermally conductive path between the heat-producing electronic device and the heat sink. The thermally conductive path can include at least a portion of a third surface of the TIM pad in thermally conductive contact with a corresponding portion of the first surface of the heat sink and at least a portion of a fourth surface of the TIM pad in thermally conductive contact with a corresponding portion of the second surface of the heat-producing electronic device.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
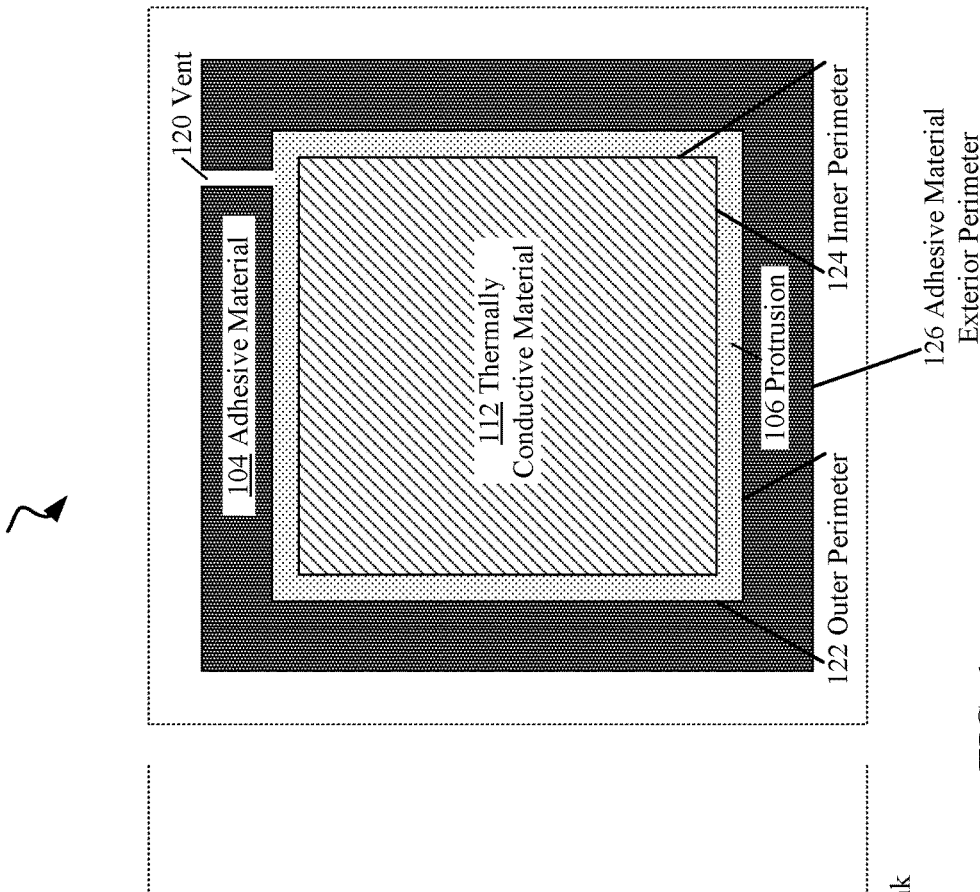
FIG. 1 depicts an apparatus for cooling a heat-producing electronic device including a thermally conductive material enclosed within an inner perimeter of a heat sink, according to embodiments of the present disclosure.
Figure 1:
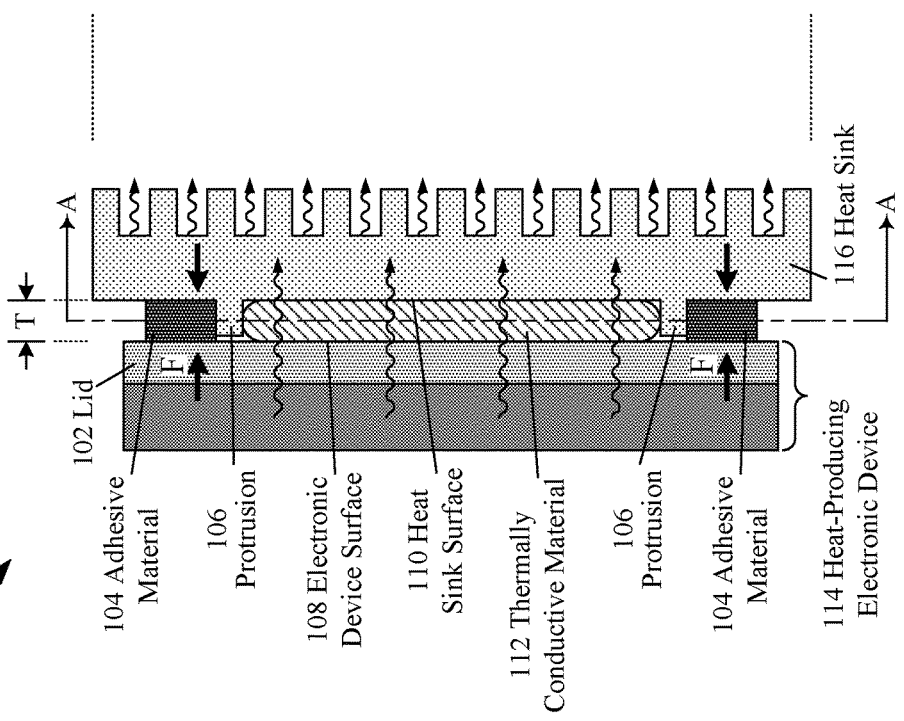

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

In the drawings and the Detailed Description, like numbers generally refer to like components, parts, steps, and processes.

DETAILED DESCRIPTION

Certain embodiments of the present disclosure can be appreciated in the context of providing efficient heat transfer between a heat-producing electronic device and a heat sink for electronic equipment such as servers, which may be used to provide data to clients attached to a server through a network. Such servers may include, but are not limited to, web servers, application servers, mail servers, and virtual servers. While not necessarily limited thereto, embodiments discussed in this context can facilitate an understanding of various aspects of the disclosure. Certain embodiments may also be directed towards other equipment and associated applications, such as providing efficient heat transfer between a heat-producing electronic device and a heat sink for electronic equipment such as computing systems, which may be used in a wide variety of computational and data processing applications. Such computing systems may include, but are not limited to, supercomputers, high-performance computing (HPC) systems, and other types of special-purpose computers. Embodiments may also be directed towards providing efficient heat transfer between a heat-producing electronic device and a heat sink for electronic equipment such as desktop workstations and computing systems, which can include heat-producing electronic devices such as graphics processing units (GPUs).

The term "heat-producing electronic device" is used herein in reference to devices such as one or more integrated circuits (ICs), and/or an electronic module which can include one or more ICs or other electronic devices. A heat-producing electronic device generates and dissipates heat in response to electrical power consumed by the device. The terms "heat-producing electronic device" and "electronic device" are used interchangeably herein without loss of meaning.

For ease of discussion, the term "heat sink" is used herein with reference to various devices used to transfer and dissipate heat generated by heat-producing electronic devices. In the context of the present discussion, the term "heat sink" can refer to and include heat spreaders, heat pipe structures, and devices designed to dissipate heat into cooling media such as ambient or circulated air, cooling liquid, e.g., water, or refrigerant.

The terms thermal interface material ("TIM") and "TIM pad" are used interchangeably herein with reference to various commercially available thermally conductive pads used to transfer heat from a heat-producing electronic device to a heat sink. TIM pads can be fabricated from a variety of different thermally conductive materials, e.g., carbon fibers, indium, copper and silver. TIM pads can be used to enhance thermal conductivity by filling in gaps and surface irregularities found on the mating surfaces of a heat-producing electronic device and a heat sink. TIM pads are generally thin, e.g., between 0.1 mm and 0.5 mm thick, pre-formed, and can be fragile. Various TIM pads can have a range of resiliency, in response to compressive forces, depending on the physical properties of materials used to construct the TIM pad.

In the context of the present discussion, the terms "copper," "aluminum" and "indium" and "silver" are used herein in reference to highly thermally conductive materials, such as metals, used in embodiments. It can be understood however that various embodiments can also be useful with regards to metallic alloys which may include copper, aluminum, indium, silver and/or other thermally conductive materials.

The trends of decreasing dimensions of ICs, e.g., processor chips, and increasing IC power dissipation have generally occurred simultaneously, resulting in increased operating temperatures and power densities of electronic devices. These converging trends have highlighted the importance of providing an efficient thermal interface between a heat-producing electronic device such as an IC or multi-IC electronic module and a cooling device such as a heat sink. Such an efficient thermal interface can be effective in maintaining the electronic device's operating temperature within a specified operating range.

In order for a thermal interface to be effective in transferring heat from a heat-producing electronic device, it may need to possess a number of attributes. Such attributes can include high thermal conductivity, and the ability to fill surface irregularities/gaps between heat-producing electronic device and heat sink surfaces, while being relatively compliant and compressible under the application of a relatively low compression force. An effective thermal interface can also be stable and reliable over time and/or repeated thermal cycles, and should not manifest "grease pumping" or thermal interface material displacement/voiding resulting from electronic device and/or heat sink thermally-induced flexing. A robust thermal interface can be durable within "shock and vibration" environments, and constructed from materials that are chemically inert with respect to each other. A desirable thermal interface can have a relatively low-cost, simple and straightforward implementation involving minimal surface preparation requirements, processing/material handling issues, and may require no latching hardware to attach the heat sink to the heat-producing electronic device.

A number of materials can be used to construct a thermal interface between a heat-producing electronic device and a heat sink. While each of these materials can possess attributes beneficial to thermal interface construction, each of them may also have characteristics that can contribute to the thermal interface's premature failure and/or degrade its performance. For example, in some applications, thermal compounds known as "thermal greases" can provide low-cost, high thermal conductivity gap filling for relatively large and/or variable gaps between a heat-producing electronic device and a heat sink. Thermal greases can, however, be subject to "grease pumping" or displacement over time and/or a number of thermal cycles, which can significantly reduce the effectiveness of the thermal interface. Thermal compounds known as "thermal gels" can provide robust gap-filling capability and high thermal conductivity; however, thermal gels can require complicated and expensive surface preparations and material storage/handling in order to ensure long-term material adhesion and thermal performance. Thermal gels can also be sensitive to degradation within "shock and vibration" environments. TIM pads can provide high thermal conductivity and be relatively easy to implement, however, TIM pads can also have limited compressibility and gap-filling capability within a compressive loading range that is safe for certain interface applications including an IC die with an exposed face. Various soft thermal gap-filler materials can also be used within thermal interfaces; however these materials generally offer relatively low thermal conductivity, rendering them unsuitable for high-output heat-producing electronic devices such as a processor or GPU. Various phase-change thermal materials can offer gap-filling with limited grease-pumping characteristics, however the phase-change properties of these materials can fail over time, in addition to phase-change material leakage from the thermal interface. Liquid metal thermal materials can offer high thermal conductivity gap-filling, however such materials are relatively costly, can leak from thermal interfaces, and can adversely react with other thermal interface components, causing catastrophic thermal interface and component failures.

The use of individual thermal interface materials, as described above, can lead to significant challenges in creating a stable, high performance, reliable thermal interface that can make and maintain effective thermal contact with both semiconductor device surfaces and corresponding heat sink devices. Both semiconductor device surfaces and heat sinks can have non-planar interface surfaces, e.g., convex or concave, which can create relatively large gaps that must be filled with thermally conductive material to ensure efficient electronic device cooling. Many thermal interface materials are available which yield acceptable thermal performance, e.g., 15-20 C-mm$^2$/W, under high thermal load, however, none of these materials also offer adhesive properties.

According to embodiments, various beneficial combinations of two or more thermally conductive and adhesive materials can be used, in combination, to create a number of adhesive-bonded thermal interface embodiments. Such embodiments can enable an interface having low thermal resistance without the need for external mechanical latches and/or attachment hardware, which can be useful on space-constrained printed circuit board (PCB) designs. In some embodiments, adhesive materials can be used in combination with various types of mechanical latches or attachment hardware, to create a number of hybrid adhesive/mechanically bonded thermal interface embodiments. Such embodiments can be useful for effectively managing area required for mechanical latches or attachment hardware, while providing a thermally interface solution that can be easily reworked.

Thermal interfaces according to embodiments can have enhanced stability, reliability and durability, relative to single-material thermal solutions, over time and/or repeated thermal cycles. Such interfaces may not manifest "grease pumping" behavior, can be durable within "shock and vibration" environments, and can be compliant and compressible under the application of a relatively low compression force. According to embodiments, such thermal interfaces can be used to fill a relatively wide range of surface irregularities and/or gaps between heat-producing electronic device and heat sink surfaces, without being subject to adverse chemical interactions between various materials. Embodiments can provide relatively low-cost, simple and straightforward thermal interface implementation with minimal surface preparation requirements, processing, and material handling issues.

Certain embodiments relate to efficient transfer of heat from a heat-producing electronic device, through adhesive-bonded thermal interface structures, to a heat sink. FIG. 1 depicts an apparatus useful for transferring heat from a heat-producing electronic device 114, through a thermally conductive material 112, e.g., a thermal grease, thermal paste, thermal gel or phase-change material, contained within an inner perimeter 124, to the heat sink 116, according to embodiments. Adhesive material 104 is used to hold the heat sink 116, thermally conductive material 112, and heat-producing electronic device 114 together as an assembly. In embodiments, the depicted apparatus can have low thermal resistance, enhanced stability, reliability and durability over time and/or repeated thermal cycles. Embodiments of the apparatus can be useful in cooling heat-producing electronic devices such as processor ICs, GPUs, multi-chip electronic modules and other electronic devices requiring robust heat transfer/cooling. Such electronic devices can be located within a wide variety of electronic equipment including computing, server, laboratory, medical and telecommunications devices and systems.

FIG. 1 includes two consistent views; side view 100 and cross-section A-A view 150. View 150 is a cross-section view of the cooling apparatus, the cooling apparatus being sectioned along line A-A of view 100, FIG. 1. As the two views 100 and 150 depict consistent features of the embodiments, the discussion of FIG. 1 herein is generally directed towards the various features without reference to a particular view. Both views 100 and 150 depict the apparatus in an assembled configuration. Embodiments of the present disclosure can be used in conjunction with a wide variety of heat-producing electronic devices and modules, including ICs.

A cooling apparatus designed according to embodiments can use adhesive materials, e.g., thermal tape, to hold a heat sink onto a heat-producing electronic device. Use of adhesive materials can enable implementation of thermal interfaces including high thermal conductivity, non-adhesive thermal pad material without the need for mechanical latches or load retention hardware. Such thermal interfaces can be useful for conserving area on space-constrained PCB designs.

Thermal measurements of test hardware constructed and operated according to embodiments have demonstrated and quantified significant efficiency increase of a thermal interface between a heat-producing electronic device and a heat sink. Measurements have shown significant reductions in electronic device operating temperature, decreases in interface thermal resistance and increases in heat sink operating temperature resulting from improved thermal interface characteristics.

Various combinations of thermal and adhesive materials/material configurations can be used in embodiments to implement a wide range of adhesive-bonded thermal interfaces. According to embodiments, combinations of multiple thermally conductive materials can be arranged in multiple layers within an adhesive perimeter to form a thermally conductive interface between one or more IC(s) and a heat sink. An arrangement of thermally conductive materials, in conjunction with the use of adhesive material(s) can provide a thermally conductive interface that makes use of the beneficial properties, e.g., thermal conductivity, of each of the materials while managing or eliminating the manifestation of material properties/characteristics, e.g., grease pumping, which are detrimental to the thermal interface.

Certain aspects of various embodiments such as the use of low-cost materials and a relatively simple, low-cost assembly process can be used to manage and/or limit the implementation cost of high-efficiency thermal interfaces. A cooling apparatus designed according to certain embodiments may be relatively simple to assemble and rework, which can allow straightforward field replacement electronic devices and heat sinks for complex systems such as water-cooled systems. Such simplicity of assembly and rework can be useful in effectively managing or reducing electronic system field maintenance costs. Embodiments of the present disclosure can be used to provide cost-effective cooling apparatuses for use with heat producing electronic devices, by using existing and proven heat sink, thermally conductive material, TIM and electronic device technologies and materials. A cooling apparatus designed according to embodiments may be compatible with existing and proven electronic devices, PCBs and electronic systems and may be a useful and cost-effective way to provide efficient cooling for heat-producing electronic devices. A cooling apparatus constructed according to embodiments of the present disclosure may be installed on an existing heat-producing electronic device within an existing electronic system.

FIG. 1 depicts a cooling apparatus that does not require mechanical fasteners to hold the heat sink 116 onto the heat-producing electronic device 114. Such an apparatus can be useful in PCB designs having limited space available for cooling devices such as heat sinks. Embodiments of the present disclosure can be useful in providing efficient and cost-effective cooling apparatuses for use with heat-producing electronic devices 114 by using existing and proven heat sink, thermally conductive material, TIM and electronic device technologies. According to embodiments, heat-producing electronic device 114 can include one or more ICs. Such IC(s) can be fabricated in a wide variety of IC design styles and technologies including, but not limited to, complementary metal-oxide semiconductor (CMOS), silicon on insulator (SOI), analog and hybrid technologies. In embodiments, a heat-producing electronic device 114 can also include other types of electronic module(s) or semiconductor device(s). Although FIG. 1 depicts a heat-producing electronic device 114 having a lid 102, according to embodiments, heat-producing electronic devices can include both conventional lidded or lidless package styles.

The electronic device surface 108 can include backside surface(s) of one or more ICs, or the lid 102 that is in thermally conductive contact with one or more heat-producing circuits, e.g., ICs, of the heat-producing electronic device 114. In some embodiments, electronic device surface 108 may be substantially planar, as depicted in FIG. 1. In some embodiments, however, electronic device surface 108 can be warped or bowed, and can have roughnesses or surface irregularities such as pits or bumps. Warp or bow of electronic device surface 108 of certain packaged devices can result from a coefficient of thermal expansion (CTE) difference between at least one electronic device and a package or substrate upon which the device is mounted. As an example, in some applications, an electronic device surface 108 may have flatness variations in a range between 75 μm to 250 μm across the surface 108.

A heat sink 116 can be useful for efficiently transferring and dissipating heat from a heat-producing electronic device 114, in order to ensure that the device 114 can function within a specified operating temperature range. A heat sink 116 can be designed to be cooled by air, refrigerant, water or other cooling fluids, and may involve the use of material phase changes, e.g., heat-pipe devices or technology. A heat sink can include heat-dissipating features such as fins, fluid circulation channels or other thermally conductive attachment features used to dissipate heat from heat-producing electronic device 114. According to embodiments, the term "heat sink" can also be used in reference to devices also referred to as "heat spreaders." In embodiments, a heat sink 116 can be fabricated from various materials that are highly thermally conductive including, but not limited to, aluminum, copper and various alloys such as boron nitride (BN). In some embodiments, the heat sink surface 110 may be substantially planar, as depicted in FIG. 1. In some embodiments, however, heat sink surface 110 can be warped or bowed, and/or can have roughness or surface irregularities such as pits or bumps. For example, in some embodiments, an electronic device surface 108 may have flatness variations in the range between 25 μm and 100 μm, across the heat sink surface 110.

In some embodiments, heat sink 116 can include a protrusion 106 that extends outward from the heat sink surface 110. The protrusion 106 can be formed as a part of heatsink surface 110 through various material forming processes, for example, casting or milling. The protrusion 106 can be useful in creating, on the heat sink surface 110, an area defined by inner perimeter 124 for the placement and containment of a thermally conductive material 112. In embodiments, protrusion 106 is located within outer perimeter 122 formed by adhesive material 104. According to embodiments, the height of protrusion 106, i.e., the distance it extends away from the heat sink surface 110, can be designed to be less than adhesive material 104 thickness "T" and the thickness of thermally conductive material 112. In embodiments, the thickness "T" also equals the distance, in an assembled configuration, between electronic device surface 108 and heat sink surface 110. Such a protrusion 106 height can ensure that protrusion 106 does not contact electronic device surface 108 when the heat sink 116 is assembled to the heat-producing electronic device 114. Avoiding contact of protrusion 106 with electronic device surface 108 can be useful in preventing damage, during assembly of the heat-electronic device 114 to the heat sink 116, and/or during a subsequent curing process that causes shrinkage of adhesive material 104. In some embodiments, electronic device surface 108 can be the backside of one or more IC die, which may be cracked or damaged if pressed upon by protrusion 106. In some embodiments, the height of the protrusion 106 can be in a range between 40% and 90% of adhesive material 104 thickness "T." For example, if compressed thickness "T" of the adhesive material is 1.0 mm, then the protrusion height can be in a range between 0.4 mm and 0.9 mm. According to embodiments, a protrusion 106 height in this range can be useful for containing, through surface tension, thermally conductive material 112 within the inner perimeter 124 and adjacent to the heat producing electronic device 114.

The boundaries formed by protrusion 106, heatsink surface 110 and electronic device surface 108, in an assembled configuration, define an inner cavity that can be useful for containing thermally conductive material 112. Containment of thermally conductive material 112, e.g., a thermal grease, can be useful in keeping the thermally conductive material 112 in contact with both electronic device surface 108 and heat sink surface 110, which can maintain an efficient thermal interface between the heat-producing electronic device 114 and the heat sink 116. Protrusion 106 can be designed to optimally and efficiently position the thermally conductive material 112 so as to maintain contact with particular high heat-dissipation area(s) of electronic device 114. This contact can ensure efficient heat transfer from particularly high heat-dissipation electronic devices such as processors or GPUs.

Physical contact between certain types of thermally conductive materials 112 and adhesive materials 104 can result in chemical interactions which can degrade desirable properties of one or both materials. Such property degradation can result in eventual catastrophic thermal interface failures. For example the bonding properties of adhesive material 104 can be compromised through contact with particular types of thermally conductive materials 112, which can result in a decrease in the bond strength of adhesive material 104. A decrease in the bond strength of adhesive material 104 can result in the adhesive material 104 failing to hold the heat-producing electronic device 114 to the heat sink 116, and/or allowing leakage of thermally conductive material 112 from the inner cavity. Protrusion 106 can be useful in providing a physical barrier to separate thermally conductive material 112 from adhesive material 104, and thus prevent the results of undesirable chemical interactions, such as a decrease in adhesive material 104 bond strength.

In embodiments where a heat-producing electronic device 114 is disposed in a vertical orientation, as depicted in view 100, containment of the thermally conductive material 112 within the inner cavity bounded by protrusion 106 can be particularly useful. Containment by protrusion 106 can prevent the thermally conductive material 112 from pooling, when heated, at the bottom of the outer perimeter 122. Such pooling can create voids over high heat dissipation areas of electronic device surface 108, which can dramatically reduce the efficiency and effectiveness of the thermal interface. Protrusion 106 can also be useful in ensuring the integrity and stability of the thermal interface over repeated thermal cycles by mitigating "grease-pumping" or migration of formable thermally conductive material 112.

According to embodiments, adhesive material 104 is located between the heat-producing electronic device 114 and heat sink 116 and is affixed to both the heat sink surface 110 and to electronic device surface 108, as depicted in view 100, FIG. 1. Adhesive material 104 can be placed or formed in a "ring" configuration that encloses protrusion 106 and thermally conductive material 112 as depicted in view 150, FIG. 1. Outer perimeter 122 corresponds to an interior edge of adhesive material 104 that encloses protrusion 106. Adhesive material exterior perimeter 126 corresponds to the exterior edge of adhesive material 104. The boundaries formed by the outer perimeter 122 of adhesive material 104, heatsink surface 110 and electronic device surface 108, in an assembled configuration, define an outer cavity that can be useful for enclosing protrusion 106 and thermally conductive material 112.

According to embodiments, adhesive material 104 can be used in place of mechanical fasteners including, but not limited to, latches, clips, screws and clamps, to hold together the assembly of heat sink 116, heat-producing electronic device 114 and thermally conductive material 112. Adhesive material 104 is useful for holding the heat sink surface 110 in an adjacent, coplanar orientation to the electronic device surface 108 of the heat-producing electronic device 114. Adhesive material 104 can be useful for creating a perimeter, i.e., outer perimeter 122, having a thickness "T" above the surface it is applied to, e.g., heat sink surface 110. In some embodiments, outer perimeter 122 can be used to contain a formable thermally conductive material 112. Containment of thermally conductive material 112 can be useful in preventing it from flowing, when heated, away from high heat-producing regions of electronic device surface 108 and from heat sink surface 110. Outer perimeter 122 can also be useful in preventing "grease pumping" or migration of thermally conductive material 112.

According to embodiments, the adhesive material 104 can be a pressure-sensitive adhesive (PSA) having relatively robust bonding properties. PSAs can include, but are not limited to, double-sided adhesive tapes, adhesive material sheets, adhesive liquids, gels, curable gels, and adhesives in aerosol formulations. In some embodiments, adhesive material 104 can include thermally conductive materials such as aluminum mesh. In some embodiments, adhesive material 104 can be thermally non-conductive, and in some embodiments adhesive material 104 can be thermally conductive and configured transfer heat between the electronic device surface 108 and the heat sink surface 110. For example, the thermal impedance of a double-sided thermally conductive tape can be approximately 1.0° C.-in$^2$/W. According to embodiments, a thermally conductive adhesive material 104 can be used as a supplemental heat-transfer element, in conjunction with a formable thermally conductive material 112 and/or with a TIM. Adhesives used in embodiments generally do not include curable thermal greases or phase-change materials such as solder. In some embodiments, adhesive material 104 can be chemically inert, i.e., non-reactive, with respect to the formable thermally conductive material 112. A chemically inert adhesive material 104 can be useful in preventing undesirable chemical reactions with thermally conductive material 112, which can prevent the degradation of desirable properties of either material. In embodiments, adhesive material 104 can have a thickness between 0.05 mm and 1.0 mm, depending on a particular application. For example, an aerosol adhesive can be at thin as 0.05 mm and a double-sided thermally conductive tape can have a thickness in a range, for example, between 0.2 mm and 0.3 mm. The adhesion strength of commercially available adhesives can be in a range, for example, between 10 psi and 30 psi.

According to embodiments, a PSA can be applied through various process including, but not limited to, printing, stenciling, dispensing, e.g., through a syringe or nozzle, or through an aerosol spray, onto at least one of the electronic device surface 108 and the heat sink surface 110. In some embodiments, adhesive material 104 can be a PSA that requires application of a specified pressure for a specified time duration in order for adhesive activation to occur. Certain PSAs can require an application pressure in a range between 5 psi and 20 psi, for several seconds in order to properly activate adhesion. For example, to affix certain double-sided adhesive tapes, an application pressure of 10 psi for 20 seconds is required to its activate adhesion. According to embodiments, application pressure and time may be precisely timed and/or measured in order to ensure to ensure proper PSA activation.

In some applications, during the operating life of the heat-producing electronic device 114, a heatsink, e.g., 116, adhesive material 104 and/or thermally conductive material 112 may need to be replaced or reattached to a heat-producing electronic device 114, through a rework process. According to embodiments, certain types of adhesive material 104 can be removable, which can allow parts of the assembly including heat sink 116 and heat-producing electronic device 114 to be reworked, repaired or replaced. By way of example, a double-sided thermal adhesive tape can require a force in a range between 60 psi and 100 psi to remove. Such a range of removal forces can depend on the temperature of the adhesive; in some applications, elevating the temperature of an adhesive material 104 may reduce the removal force, and facilitate the adhesive's removal.

In some embodiments, an outline of the adhesive material 104 can define at least one vent 120, i.e., opening, formed between the inner perimeter 124 and adhesive material exterior perimeter 126. Vent 120 can be useful for equalizing pressures internal to and external to adhesive material 104. Such pressures can be created during thermal excursion cycles or possibly from outgas sing of thermally conductive material 112. Pressure equalization through vent 120 can prevent catastrophic thermal interface failure by minimizing pressure changes within the outer cavity. Minimizing pressure changes can be useful in preventing the detachment or dislodging of the adhesive material 104 from the heat sink surface 110 and/or electronic device surface 108. In embodiments where the heat-producing electronic device 114 is mounted vertically, Vent 120 can be located on a top or upper surface of adhesive material 104.

In some embodiments, affixing of the heat sink 116 to the heat-producing electronic device 114 can include an adhesive material curing process. Curing the adhesive material 104 can be useful in setting or "fixing" the adhesive, which can enhance and strengthen the bond between the heat-reducing electronic device 114 and the heat sink 116. An adhesive material curing process can also cause shrinkage or contraction of the adhesive material 104. A curing process can include maintaining an adhesive at specified temperature for a specified amount of time. The specified temperature and time may be dependent on factors such as the adhesive type/formulation and physical dimensions of the adhesive. For example, in some embodiments a particular adhesive may be cured at a temperature of 70° C. for 24 hours, followed by curing at a temperature of 22° C. for 7 days. Adhesive types can also include two-part "blended" adhesives which may not require a curing process, or which may cure at room temperature.

Certain types of adhesive material 104 can shrink during curing process, which can provide a tensile force "F" between the heat sink surface 110 and the electronic device surface 108 in addition to a tensile force provided the adhesive prior to a curing process. Tensile force "F" can serve to pull the heat producing electronic device 114 and the heat sink 116 towards each other, which can result in compression of thermally conductive material 112 that reduces the thermally conductive material 112 thickness "T," or "bond line" thickness. Reduction of the thickness "T" can shorten the heat conduction path length through the thermally conductive material 112. Shortening the conduction path length can lower the thermal resistance of the thermally conductive material 112 as well as the entire thermal interface. Lowering thermal resistances can result in increased efficiency and effectiveness of thermal interface between thermally conductive material 112 and the electronic device surface 108 and heat sink surface 110. In embodiments, the time and temperature of a curing process can be precisely controlled so that the protrusion 106 does not contact or press on the electronic device surface 108 during or after the curing process. The shrinking or compression of adhesive material 104 can also be used to effectively reduce the protrusion 106 height necessary to contain the thermally conductive material 112 within the inner cavity.

Thermally conductive material 112 can be useful in cooling the heat-producing electronic device 114 by providing an efficient thermal interface path having low thermal resistance between electronic device surface 108 and heat sink surface 110. Such a thermal interface path can be suitable for removing large amounts of heat from a heat-producing electronic device 114, for example a high power output processor or GPU. According to embodiments, thermally conductive material 112 can be a "formable" material, i.e., one that generally responds to compressive forces by assuming the shape of a cavity or structure containing it. A TIM pad, in contrast to a "formable" material, may have a certain degree of resiliency, however, will not generally assume the shape of a cavity or structure containing it in response to compressive forces applied to it. Thermally conductive material 112 can be useful in filling in heat sink surface 110 and electronic device surface 108 roughnesses, reducing air gaps, and providing increased surface area for heat transfer and more efficient electronic device cooling. According to embodiments, thermally conductive material 112 can be a formable, highly thermally conductive compound having relatively low thermal resistance. For example, such compounds may have thermal resistance in a range between 0.032° C.-cm$^2$/W and 0.162° C.-cm$^2$/W. In embodiments, thermally conductive materials 112 can be resilient or non-resilient. Thermally conductive materials 112 can include, but are not limited to, thermal greases, pastes, gels, curable gels and binders with metal particulates. In embodiments, thermally conductive material 112 can be applied, to heat sink surface 110 or electronic device surface 108, by dispensing or stenciling to a thickness of up to 1.0 mm. In embodiments, use of a thermally conductive material 112 and adhesive material 104 which are chemically inert with respect to one another can be useful in preventing the degradation of useful properties of either material.

In embodiments, the inner cavity is filled with a precisely measured and dispensed volume of thermally conductive material 112 sufficient to fill the inner cavity. If an amount of thermally conductive material 112 placed in the inner cavity is insufficient to fill the inner cavity, significant portions of the heat sink surface 110 and/or electronic device surface 108 may not be in thermally conductive contact with the thermally conductive material 112. Such lack of contact can diminish overall thermal conductivity and cooling capacity of the thermal interface. If an amount of thermally conductive material 112 placed in the inner cavity is in excess of the capacity of the inner cavity, the excess thermally conductive material 112 may flow outwards from the cavity and break the surface tension, which can cause a pool of thermally conductive material 112 to form despite the protrusion 106. Such pooling can also diminish overall thermal conductivity and cooling capacity of the thermal interface.

Pressing the heat sink 116 and the heat-producing electronic device 114 together with a compressive force can be useful in spreading out the formable thermally conductive material 112 to fill in the inner cavity containing it. Such compression can also be useful in flattening and/or thinning the thermally conductive material 112 bond line. Flattening the bond line can create an efficient thermal interface between the heat-producing electronic device 114 and the heat sink 116, and can improve heat sink and electronic device surface thermal interface characteristics.

Figure 2:
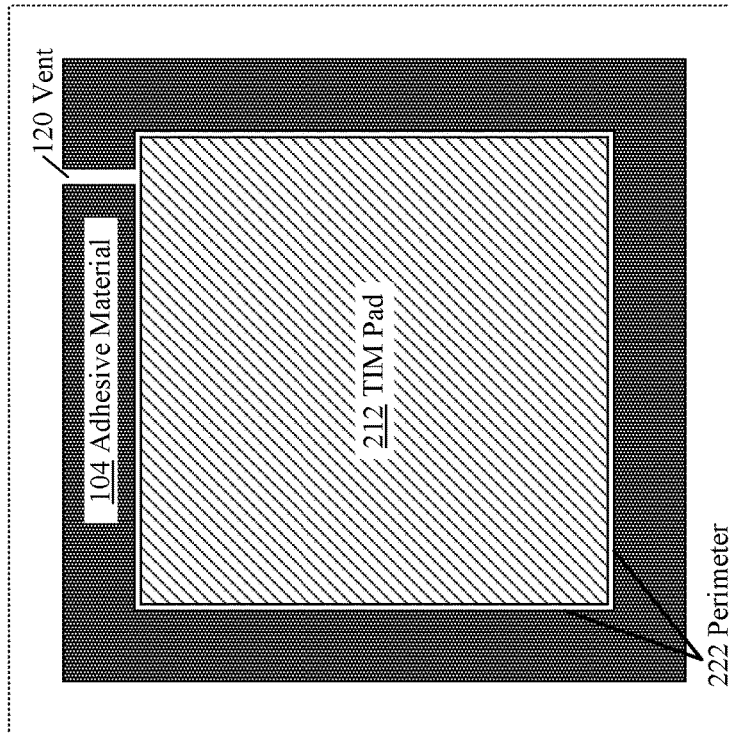
FIG. 2 depicts an apparatus for cooling a heat-producing electronic device including a thermally conductive pad enclosed within a perimeter, according to embodiments consistent with the figures.
Figure 2:
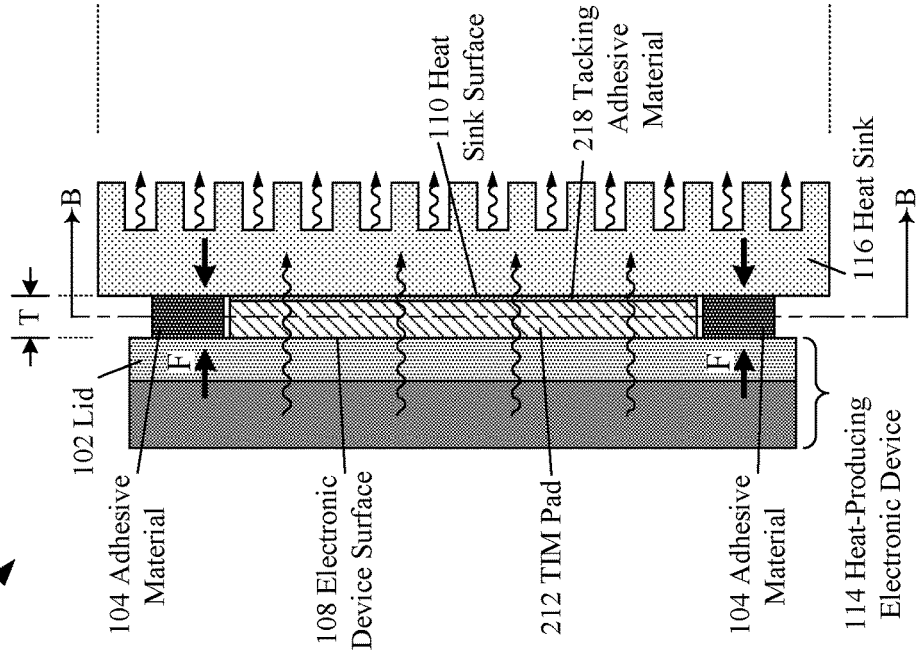

FIG. 2 depicts an apparatus useful for transferring heat from a heat-producing electronic device 114, through a thermally conductive TIM pad 212 contained within an inner perimeter 222 of adhesive material 104, to the heat sink 116, according to embodiments consistent with the figures. Adhesive material 104 is used to hold the heat sink 116, TIM pad 212, and heat-producing electronic device 114 together as an assembly. In embodiments, the depicted apparatus can have low thermal resistance, and can be useful in cooling heat-producing electronic devices such as processor ICs, GPUs and multi-chip electronic modules.

FIG. 2 includes two consistent views; side view 200 and cross-section B-B view 250. View 250 is a cross-section view of the cooling apparatus, the cooling apparatus being sectioned along line B-B of view 200, FIG. 2. As the two views 200 and 250 depict consistent features of the embodiments, the discussion of FIG. 2 herein is generally directed towards the various features without reference to a particular view. Both views 200 and 250 depict the apparatus in an assembled configuration.

FIG. 2 depicts a cooling apparatus that does not require mechanical fasteners to hold the heat sink 116 onto the heat-producing electronic device 114. Such an apparatus can be useful in PCB designs having limited space available for cooling devices such as heat sinks. According to embodiments, adhesive material 104 can be used in place of mechanical fasteners including, but not limited to, latches, clips, screws and clamps, to hold together the assembly of heat sink 116, heat-producing electronic device 114 and TIM pad 212. In embodiments, adhesive material 104 is located between the heat-producing electronic device 114 and heat sink 116 and is affixed to both the heat sink surface 110 and to electronic device surface 108, as depicted in view 200, FIG. 2. Adhesive material 104 can be placed or formed in a "ring" having a perimeter 222 corresponding to an interior edge of adhesive material 104.

In embodiments, TIM pad 212 is located within perimeter 222, as depicted in view 250, FIG. 2. In an assembled configuration, the boundaries formed by the perimeter 222 of adhesive material 104, heatsink surface 110 and electronic device surface 108 define a cavity that can be useful for containing TIM pad 212. Adhesive material 104 has a thickness "T" above the surface it is applied to, e.g., heat sink surface 110. Containment of a TIM pad 212, e.g., a carbon fiber pad, can be useful in keeping at least a portion of one surface of the TIM pad 212 in thermally conductive contact with electronic device surface 108, and at least a portion of the opposing surface of the TIM pad 212 in thermally conductive contact with heat sink surface 110. Such thermally conductive contact allows TIM pad 212 to cool the heat-producing electronic device 114 by providing an efficient, thermally conductive path having low thermal resistance between the electronic device surface 108 and the heat sink surface 110. In some embodiments, an adhesive material 104 that is thermally conductive can be used as a supplemental heat-transfer element in conjunction with a TIM pad 212. Particular high heat-dissipation area(s) of electronic device surface 108 can correspond to certain electronic devices having relatively high heat dissipation, such as a processors or GPUs. In embodiments, adhesive material 104 can be useful in optimally and efficiently positioning the TIM pad 212 so that it remains in a fixed position and maintains thermally conductive contact with these high heat-dissipation area(s), which can result in efficient heat transfer.

Adhesive material 104 can be chemically inert, i.e., non-reactive, with respect to TIM pad 212. A chemically inert adhesive material 104 can be useful in preventing undesirable chemical reactions with the TIM pad 212, which can prevent the degradation of useful properties of either material. In some applications, during the operating life of the heat-producing electronic device 114, a heatsink, e.g., 116, adhesive material 104 and/or TIM pad 212 may need to be replaced or reattached to a heat-producing electronic device 114, through a rework process. According to embodiments, certain types of adhesive material 104 can be removable, which can allow the assembly including heat sink 116 and heat-producing electronic device 114 to be reworked, repaired or replaced.

Certain types of adhesive material 104 can shrink during curing process, which can provide a tensile force "F" between the heat sink surface 110 and the electronic device surface 108 in addition to a tensile force provided the adhesive prior to a curing process. Tensile force "F" can serve to pull the heat producing electronic device 114 and the heat sink 116 towards each other, which can result in compression of TIM pad 212 that reduces the TIM pad 212 thickness. Reduction of the thickness "T" of TIM pad 212 can shorten the heat conduction path length through the TIM pad 212, which can lower the thermal resistance of the TIM pad 212 and the thermal resistance of the entire thermal interface. Lowering thermal resistances can result in increased efficiency and effectiveness of thermal interface between TIM pad 212 and the electronic device surface 108 and heat sink surface 110.

In contrast to a "formable" thermally conductive material, a TIM pad 212 may have a particular degree of resiliency, however a TIM pad 212 will not generally, in response to applied compressive forces, assume the shape of a cavity or structure containing it. A TIM pad 212 maintaining its overall shape can be useful in maintaining contact, over time and multiple thermal/flexing cycles, between the TIM pad 212 and the heat sink surface 110 and the electronic device surface 108. Unlike a formable thermally conductive material, a TIM pad is a solid-state material, not subject to reflow, "grease pumping" or shape changing behaviors when heated. According to embodiments, TIM pad 212 can be a highly thermally conductive element having relatively low thermal resistance. For example, such TIMs may have thermal resistance in a range between $0.010°$ C.-cm$^2$/W and $0.100°$ C.-cm$^2$/W. Certain TIM pads can have a low thermal resistance relative to a thermally conductive material 112, FIG. 1. According to embodiments, TIM pad 212 can be resilient or non-resilient, and is generally a pre-formed, thermally conductive element that is not an intrinsic part of an electronic device and/or electronic device package. It can be understood that a TIM pad 212 is not an adhesive and does not exhibit adhesive properties or forces. In some embodiments a compliant, compressible and resilient TIM pad 212 can be useful in providing enhanced surface thermal interfaces with heat sink surface 110 and electronic device surface 108 by at least partially filling in roughnesses and reducing air gaps between the surfaces. Enhanced surface thermal interfaces can enable efficient heat transfer and electronic device cooling by creating a low thermal resistance path between heat-producing electronic device 114 and heat sink 116.

TIM pad 212 can be fabricated from materials including, but are not limited to, carbon fibers, metal, phase-change materials, compressible solid graphite and composite materials. A soft metal alloy thermal interface material (SMA-TIM) can include a compressible and malleable metal such as indium, which can provide uniform thermal resistance at relatively low applied stress in a compressed interface. For example, a pressure range between 35 psi and 100 psi can yield relatively low thermal resistances compared to formable thermally conductive materials such as thermal greases, pastes or gels. For example, a 0.05-0.3 mm thick SMA-TIM can have a thermal conductivity of $0.04°$ C.-cm$^2$/W at an applied pressure of 60 psi. TIM pads can have a limited gap filling range, for example, certain TIM pads can provide 150 μm (6 mils) of gap filling compliance.

Certain types of pre-formed TIM pads 212, e.g., graphite pads, can be relatively fragile and subject to damage during handling and/or assembly process(s). For example, if a TIM pad 212 falls out of the cavity formed between a heat-producing electronic device and a heat sink, it may be damaged. In embodiments, a tacking adhesive material 218 can be particularly useful in preventing possible damage to the TIM pad 212 by holding or tacking a TIM pad 212 in an aligned position adjacent to the heat sink surface 110 or electronic device surface 108 within the cavity during an assembly process. In embodiments, small amounts of a tacking adhesive material 218 can be applied to a surface of the TIM, the heat sink surface 110 or electronic device surface 108 prior to placement of the TIM pad 212 within the cavity. For example, a dot of tacking adhesive material 218 can be applied to the center of an area for receiving a TIM pad on the heat sink surface 110 or electronic device surface 108. Upon contact with the opposing heat sink surface 110 and electronic device surface 108, or upon compression of the thermal interface assembly, tacking adhesive material 218 can spread out into a thin layer across at least a portion of the opposing surface(s). Tacking adhesive material 218 can have a relatively low tendency to reflow when heated, and in embodiments may not cover the entire area close by perimeter 222. According to embodiments, tacking adhesive material 218 can include various material types such as transient evaporative materials, e.g., isopropyl alcohol, or thermally conductive materials and/or adhesives such as thermal greases, pastes or gels. Tacking adhesive material 218 can be useful in providing a thin, "tacky," i.e., temporary, adhesive layer useful for holding the TIM pad 212 in place for the duration of the assembly process.

Figure 3:
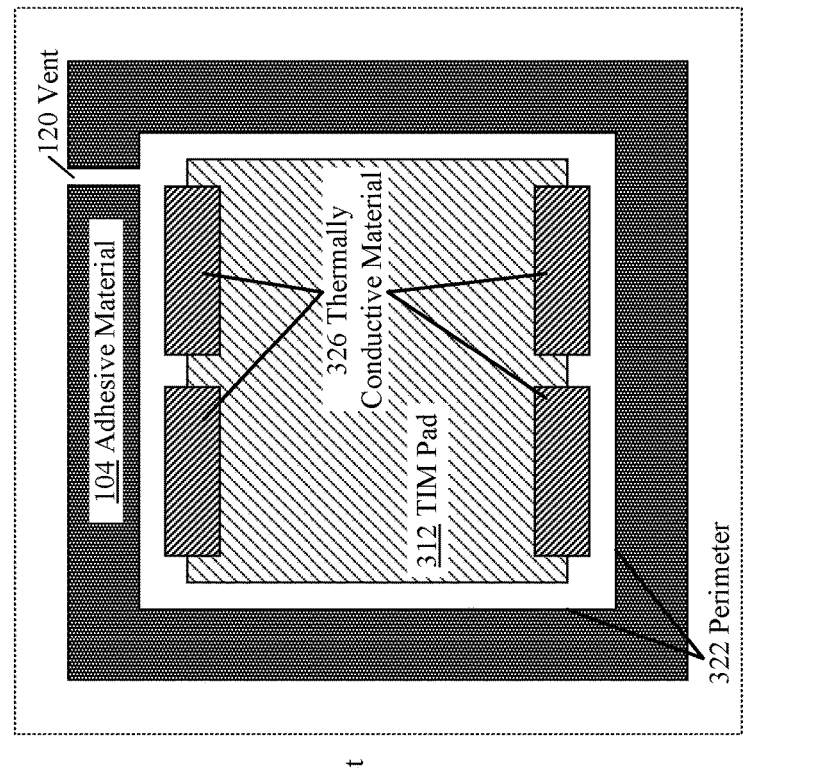
FIG. 3 depicts an apparatus for cooling a heat-producing electronic device including a thermally conductive pad and a thermally conductive material enclosed within a perimeter, according to embodiments consistent with the figures.
Figure 3:
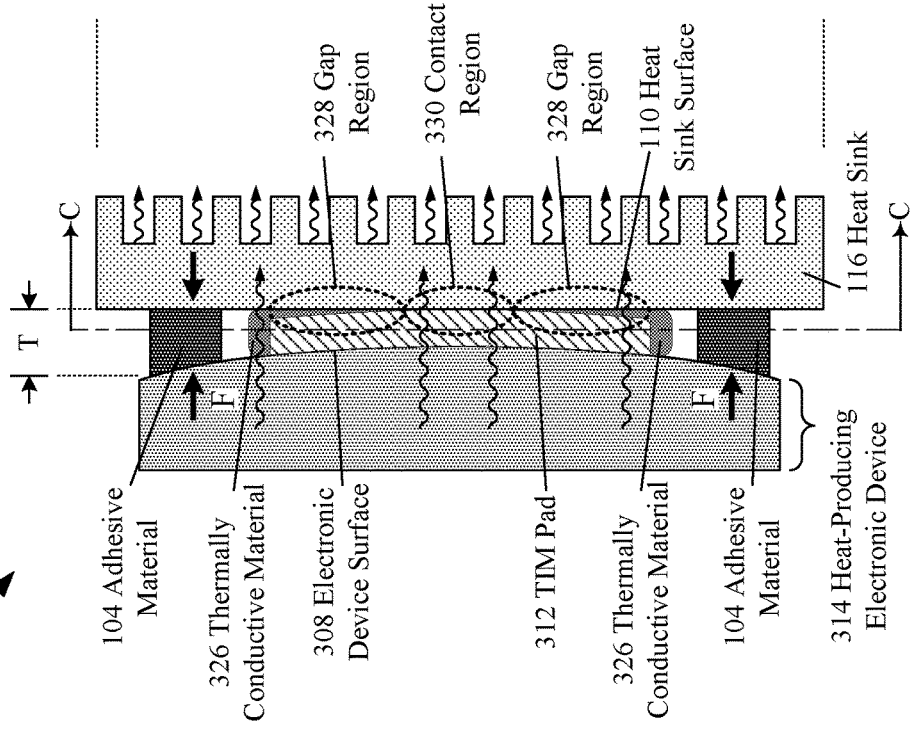

FIG. 3 depicts an apparatus useful for transferring heat from a heat-producing electronic device 314, through a TIM pad 312 and thermally conductive material 326 contained within a perimeter 322 of adhesive material 104, to heat sink 116, according to embodiments consistent with the figures. Adhesive material 104 is used to hold the heat sink 116, TIM pad 312, thermally conductive material 326 and heat-producing electronic device 314 together as an assembly. In embodiments, the depicted apparatus can have low thermal resistance, and can be useful in cooling heat-producing electronic devices such as processor ICs, GPUs and multi-chip electronic modules.

FIG. 3 includes two consistent views; side view 300 and cross-section C-C view 350. View 350 is a cross-section view of the cooling apparatus, the cooling apparatus being sectioned along line C-C of view 300, FIG. 3. As the two views 300 and 350 depict consistent features of the embodiments, the discussion of FIG. 3 herein is generally directed towards the various features without reference to a particular view. View 300 depicts the apparatus in an assembled configuration, while view 350 depicts the apparatus prior to assembly.

FIG. 3 depicts a cooling apparatus that does not require mechanical fasteners to hold the heat sink 116 onto the heat-producing electronic device 314. Such an apparatus can be useful in PCB designs having limited space available for cooling devices such as heat sinks. According to embodiments, adhesive material 104 can be used in place of mechanical fasteners including, but not limited to, latches, clips, screws and clamps, to hold together the assembly of heat sink 116, heat-producing electronic device 314, thermally conductive material 326 and TIM pad 312. Thermally conductive material 326 can be understood to be consistent, particularly in respect to thermal and mechanical properties, with thermally conductive material 112, FIG. 1. Similarly, TIM pad 312 can be understood to be consistent with TIM pad 212, FIG. 2. Thermally conductive material 326 can be chemically inert, i.e., non-reactive, with respect to TIM pad 312 and adhesive material 104. A chemically inert adhesive material 104 can be useful in preventing undesirable chemical reactions with the TIM pad 312, which can prevent the degradation of useful properties of either material. In embodiments, adhesive material 104 is located between the heat-producing electronic device 314 and heat sink 116 and is affixed to both the heat sink surface 110 and to electronic device surface 308, as depicted in view 300, FIG. 3.

Although a lid, e.g., 102, FIG. 1, is not depicted as part of heat-producing electronic device 314 in FIG. 3, in some embodiments, heat-producing electronic device 314 can include a lid. Adhesive material 104 can be placed or formed in a "ring" having a maximum thickness "T" above the surface it is applied to, e.g., heat sink surface 110 and a perimeter 322 corresponding to an interior edge of adhesive material 104.

In embodiments, TIM pad 312 and thermally conductive material 329 are located within perimeter 322, as depicted in view 350, FIG. 3. In an assembled configuration, the boundaries formed by the perimeter 322 of adhesive material 104, heatsink surface 110 and electronic device surface 308 define a cavity that can be useful for containing thermally conductive material 326 and TIM pad 312. Containment of a TIM pad 312, e.g., a carbon fiber pad, can be useful in keeping at least a portion of one surface of the TIM pad 312 in thermally conductive contact with electronic device surface 308, and at least a portion of the opposing surface of the TIM pad 312 in thermally conductive contact with heat sink surface 110. Such thermally conductive contact allows TIM pad 312 in conjunction with thermally conductive material 326 to cool the heat-producing electronic device 314 by providing an efficient, thermally conductive path having low thermal resistance between the electronic device surface 308 and the heat sink surface 110. Particular high heat-dissipation area(s) of electronic device surface 308 can correspond to certain electronic devices having relatively high heat dissipation, such as a processors or GPUs. In some embodiments, these areas can correspond to contact region 330, view 300. In embodiments, thermally conductive material 326 and adhesive material 104 can be useful in optimally and efficiently positioning the TIM pad 312 so that it remains in a fixed position and maintains thermally conductive contact with these high heat-dissipation area(s), which can result in efficient heat transfer. In some embodiments, an adhesive material 104 that is thermally conductive can be used as a supplemental heat-transfer element in conjunction with a TIM pad 312.

According to embodiments, both the electronic device surface 308 and the heat sink surface 110 can independently deviate from a completely planar surface profile. Each of the surfaces 110 and 308 can include any combination of convex, concave, warped, bowed, rippled, rough, pitted and bumped surface characteristics. For example, electronic device surface 308 can have overall flatness deviations from a completely planar surface in a range between 75 μm and 250 μm across the surface 308 of the electronic device. Similarly, a heat sink surface 110 can have overall flatness deviations in a range between 25 μm and 100 μm across surface 110 of the heat sink. View 300 depicts electronic device surface 308 as having a convex surface profile. Flatness deviation such as warp or bow, in some embodiments, can result from a CTE difference between at least one electronic device and the substrate/package upon which the device is mounted. In this discussion, it is understood that the "electronic device" and the "substrate/package" referred to above are both elements of the heat-producing electronic device 314.

According to embodiments, the electronic device surface 308 can include backside surface(s) of one or more ICs, or a lid 102 that is in thermally conductive contact with one or more heat-producing circuits, e.g., ICs, of the heat-producing electronic device 314. In embodiments where the heat-producing electronic device 314 includes a lid, e.g., 102, FIG. 1, such a lid can also assume a non-planar shape, e.g., convex or concave, in accordance with a corresponding non-planar shape of the heat-producing electronic device 314. The above-described deviations from a completely planar surface profile can result in gaps, within thermal interfaces between two mating, non-planar, surfaces, as depicted by gap regions 328, view 300. Such gaps can be relatively narrow and formed, for example, as a result of a protruding feature of a warped, convex heat-producing electronic device 314 coming into contact with a more planar heat sink surface 110. If such gaps remain unfilled with thermally conductive material, the thermal conductivity of a thermal interface between the surfaces can be significantly degraded, relative to thermal interfaces between more planar surfaces having a smaller gap size.

In some embodiments a compliant, compressible and resilient TIM pad 312 can be useful in enhancing thermal interfaces with heat sink surface 110 and electronic device surface 308 by at least partially filling in roughnesses and reducing air gaps between the surfaces. The gap-filling capability of commercially available, solid-state TIM pads having high thermal conductivity, e.g., 312, is typically in a limited range between 25 µm and approximately 125 µm-150 µm (≈6 mils) of compliance between adjacent thermally conductive surfaces. This thickness generally corresponds to the contact region 330, view 300. This thickness range corresponds to a range of application pressures suitable for thermal interfaces that directly contact the back of an IC die. The maximum distance between two mated, thermally conductive surfaces can be, in some embodiments, in a range between 200 µm and 250 µm. Such distances can leave gaps between a significant portion of the mating surfaces, e.g., gap regions 328, view 300, in cases where a TIM is the only thermally conductive material positioned between the thermally conductive surfaces.

In embodiments, thermally conductive material 326 can be applied, e.g., dispensed or stenciled, onto an area of either the heat sink surface 110 or the electronic device surface 308 corresponding to a perimeter of TIM pad 312, as depicted in view 350. As an example, certain thermally conductive materials 326 can be stenciled to a thickness of up to 300 µm onto a surface. View 350 depicts thermally conductive material 326 prior to an assembly process. Thermally conductive material 326 can be applied to either surface 110 or 308, for example, as rectangular shapes, dots, or a contiguous line that overlap(s) the outer edge of TIM pad 312, as depicted in view 350. According to embodiments, the TIM pad 312 at least partially overlaps the formable thermally conductive material 326 when the heat-producing electronic device 314, TIM pad 312, thermally conductive material 326 and heat sink 116 are assembled. In embodiments, compressive force applied during assembly process can cause thermally conductive material 326 to fill gap regions 328, as depicted in view 300. Filling gap regions 328 can be useful for enhancing the overall conductivity of a thermal interface by filling gaps having shapes or thicknesses which cannot be effectively filled by TIM pad 312. Such a relatively thin layer of thermally conductive material 326 can have a lower tendency to reflow, when heated, than a thicker layer that might be used in thermal interfaces not including a TIM pad 312.

View 300 depicts thermally conductive material 326 pressed into and filling gap regions 328 between TIM pad 312 and heat sink surface 110, however, in some embodiments, thermally conductive material 326 can be used to fill similar gap regions between TIM pad 312 and electronic device surface 308. In embodiments, thermally conductive material 326 can be useful in preventing possible damage to the TIM pad 312 by holding or tacking a TIM pad 312 in an aligned position within the cavity, adjacent to the heat sink surface 110 or electronic device surface 308, for the duration of the assembly process. Such tacking can also be useful to avoid the need for TIM alignment pins, which can increase thermal interface cost and complexity, and can consume critical hardware real estate on a PCB.

The use of two thermal interface materials each with unique, beneficial properties, e.g., thermally conductive material 326 and TIM pad 312, in a stacked combination can provide a reliable, stable and efficient thermal interface between a heat-producing electronic device and a heat sink. Embodiments of the present disclosure can provide a combination of robust TIM compression and full "gap-filling" bond line coverage over an entire non-planar electronic device surface, e.g., 308. Such full coverage may not be possible using traditional thermal interface techniques. Embodiments can also provide enhanced thermal conductivity, compared to other thermal interface implementations, through the use of a TIM pad in conjunction with a relatively thin layer of thermally conductive material. According to embodiments, a high-performance, reliable thermal interface can be created to fill cumulative thermal interface gaps that are greater than 300 µm. If the thermal conductivity of a TIM pad, e.g., 312, is greater than the conductivity of thermally conductive material, e.g., 326, an assembly including a TIM pad supplemented with a relatively thin layer of thermally conductive material can provide higher overall thermal conductivity than an assembly including just a relatively thick layer of thermally conductive material.

In embodiments, the use of a highly compressible, dispensable thermally conductive material at thermal interface perimeter locations can allow full compressibility of the TIM, which can result in overall thermal interface performance enhancement and reliability. A dispensable or stencil-printed thermal interface material, e.g., thermal grease, can be applied over relatively low power dissipation regions, e.g., those corresponding to memory devices, of an electronic device surface. These regions can correspond to larger thermal interface gaps than gaps adjacent to higher power interface regions, e.g., those corresponding to a processor or GPU ICs. Thermally conducting gap-filling materials can be useful at thermal interface peripheral locations and/or corners to provide mechanical damping to enhance TIM interface integrity during shock and vibration events that can occur during product handling or shipment.

Embodiments of the present disclosure can use the lateral heat conduction of a TIM pad in conjunction with the conduction of overlapping thermal interface material and TIM pad layers to assist in heat removal from electronic device surface areas adjacent to relatively thick thermal interface material layers. Embodiments can provide improvements and thermal interface performance relative to thermal interfaces that include only thermally conductive materials or only TIM pads. Some embodiments can useful in mitigating or eliminating, through the placement of a TIM pad in relatively thin, high-strain bond line regions adjacent to high power electronic devices, the phenomena of "grease pumping" and thermal gel delamination.

In some applications, during the operating life of the heat-producing electronic device 314, a heatsink, e.g., 116, adhesive material 104, thermally conductive material 326 and/or TIM pad 312 may need to be replaced or reattached to a heat-producing electronic device 314, through a rework process. According to embodiments, certain types of adhesive material 104 can be removable, which can allow the assembly including heat sink 116 and heat-producing electronic device 314 to be reworked, repaired or replaced.

Certain types of adhesive material 104 can shrink during curing process, which can provide a tensile force "F" between the heat sink surface 110 and the electronic device surface 308 in addition to a tensile force provided the adhesive prior to a curing process. Tensile force "F" can serve to pull the heat producing electronic device 314 and the heat sink 116 towards each other, which can result in compression of TIM pad 312 that reduces the TIM pad 312 thickness. The resulting compression can also be useful in forcing thermally conductive material 326 into gap regions 328, view 300, from area(s) where thermally conductive material 326 is initially dispensed, 328, view 350. Reduction of the thickness "T" of TIM pad 312 can shorten the heat conduction path length through the TIM pad 312, which can lower the thermal resistance of the TIM pad 312 and the thermal resistance of the entire thermal interface. The insertion of thermally conductive material 326 into gap regions can also be useful for lowering the thermal resistance of the entire thermal interface. Lowering thermal resistances can result in increased efficiency and effectiveness of thermal interface between TIM pad 312 and the electronic device surface 308 and heat sink surface 110.

Figure 4:
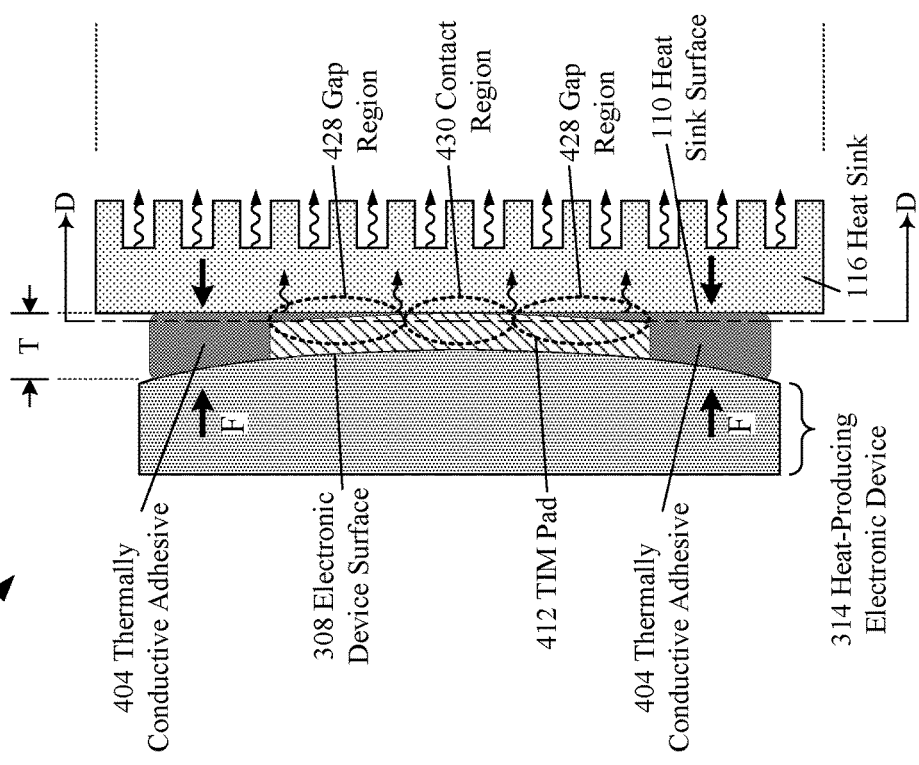
FIG. 4 depicts an apparatus for cooling a heat-producing electronic device including a thermally conductive pad and a thermally conductive adhesive, according to embodiments consistent with the figures.
Figure 4:
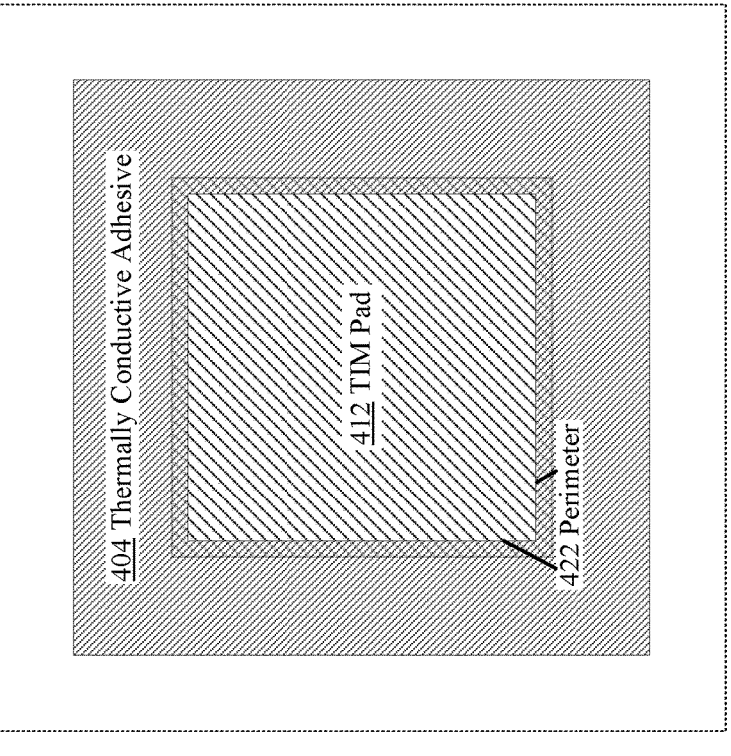

FIG. 4 depicts an apparatus useful for transferring heat from a heat-producing electronic device 314, through a TIM pad 412 and thermally conductive adhesive 404, to the heat sink 116, according to embodiments consistent with the figures. In embodiments, TIM pad 412 partially overlaps and is contained within thermally conductive adhesive 404. Thermally conductive adhesive 404 is used to hold the heat sink 116, TIM pad 412 and heat-producing electronic device 314 together as an assembly, as depicted. In embodiments, the depicted apparatus can have low thermal resistance, and can be useful in cooling heat-producing electronic devices such as processor ICs, GPUs and multi-chip electronic modules.

FIG. 4 includes two consistent views; side view 400 and cross-section D-D view 450. View 450 is a cross-section view of the cooling apparatus, the cooling apparatus being sectioned along line D-D of view 400, FIG. 4. As the two views 400 and 450 depict consistent features of the embodiments, the discussion of FIG. 4 herein is generally directed towards the various features without reference to a particular view. View 400 depicts the apparatus in an assembled configuration, while view 450 depicts the apparatus prior to assembly.

View 450 depicts the overlapping positioning of thermally conductive adhesive 404 and the TIM pad 412, prior to an assembly process and the application of a compressive force. View 400 depicts the thermally conductive adhesive 404 and the TIM pad 412 in an assembled configuration, following the application of a compressive force. View 400 depicts the results of the thermally conductive adhesive 404 being pressed into a gap between the TIM pad 412 and the heat sink 116.

FIG. 4 depicts a cooling apparatus that does not require mechanical fasteners to hold the heat sink 116 onto the heat-producing electronic device 314. Such an apparatus can be useful in PCB designs having limited space available for cooling devices such as heat sinks. According to embodiments, thermally conductive adhesive 404 can be used in place of mechanical fasteners including, but not limited to, latches, clips, screws and clamps, to hold together the assembly of heat sink 116, heat-producing electronic device 314 and TIM pad 412. TIM pad 412 can be understood to be consistent with TIM pad 212, FIG. 2. Thermally conductive adhesive 404 can be understood to be in adhesive material having thermally conductive properties. For example, certain commercially available thermally conductive adhesives 404 can have a thermal impedance of 0.1° C.-in2/W at a recommended bond line thickness of 0.28 mm (280 µm).

Thermally conductive adhesive 404 can be chemically inert, i.e., non-reactive, with respect to TIM pad 412. A chemically inert thermally conductive adhesive 404 can be useful in preventing undesirable chemical reactions with the TIM pad 412, which can prevent the degradation of useful properties of either material. In embodiments, thermally conductive adhesive 404 is located between the heat-producing electronic device 314 and heat sink 116 and is affixed to both the heat sink surface 110 and to electronic device surface 308, as depicted in view 400, FIG. 4. Although a lid, e.g., 102, FIG. 1, is not depicted as part of heat-producing electronic device 314 in FIG. 4, in some embodiments, heat-producing electronic device 314 can include a lid. Thermally conductive adhesive 404 can be placed or formed in a "ring" having a maximum thickness "T" above the surface it is applied to, e.g., heat sink surface 110, and a perimeter 422 corresponding to an interior edge of thermally conductive adhesive 404.

In embodiments, the outline of TIM pad 412 at least partially overlaps with perimeter 422 of thermally conductive adhesive 404, as depicted in view 450, FIG. 4. In an assembled configuration, thermally conductive adhesive 404, heatsink surface 110 and electronic device surface 308 define a cavity that can be useful for containing and TIM pad 412. Containment of a TIM pad 412, e.g., a carbon fiber pad, can be useful in keeping at least a portion of one surface of the TIM pad 412 in thermally conductive contact with electronic device surface 308, and at least a portion of the opposing surface of the TIM pad 412 in thermally conductive contact with heat sink surface 110.

Such thermally conductive contact allows TIM pad 412 in conjunction with thermally conductive adhesive 404 to cool the heat-producing electronic device 314 by providing an efficient, thermally conductive path having low thermal resistance between the electronic device surface 308 and the heat sink surface 110. Particular high heat-dissipation area(s) of electronic device surface 308 can correspond to certain electronic devices having relatively high heat dissipation, such as a processors or GPUs. In some embodiments, these areas can correspond to contact region 430, view 400. In embodiments, thermally conductive adhesive 404 can be useful in optimally and efficiently positioning the TIM pad 412 so that it remains in a fixed position and maintains thermally conductive contact with these high heat-dissipation area(s), which can result in efficient heat transfer. In embodiments, a thermally conductive adhesive 404 be used as a supplemental heat-transfer element in conjunction with TIM pad 412.

Deviations from a completely planar heat sink or heat-producing electronic device surface profile can result in gaps, within thermal interfaces between two mating, non-planar, surfaces, as depicted by gap regions 428, view 400. Such gaps can be relatively narrow and formed, for example, as a result of a protruding feature of a warped, convex heat-producing electronic device coming into contact with a more planar heat sink surface. If such gaps remain unfilled with thermally conductive material, the thermal conductivity of a thermal interface between the surfaces can be significantly degraded, relative to thermal interfaces between more planar surfaces having a smaller gap size. In some embodiments a compliant, compressible and resilient TIM pad 412 can be useful in enhancing thermal interfaces with heat sink surface 110 and electronic device surface 308 by at least partially filling in roughnesses and reducing air gaps between the surfaces. The gap-filling capability of commercially available, solid-state TIM pads having high thermal conductivity, e.g., 412, is typically in a limited range between 25 μm and approximately 125-150 μm (≈6 mils) of compliance between adjacent thermally conductive surfaces. This thickness generally corresponds to the contact region 430, view 400. This thickness range corresponds to a range of application pressures suitable for thermal interfaces that directly contact the back of an IC die. The maximum distance between two mated, thermally conductive surfaces can be, in some embodiments, in a range between 200 μm and 250 μm. Such distances can leave gaps between a significant portion of the mating surfaces, e.g., gap regions 428, view 400, in cases where a TIM is the only thermally conductive material positioned between the thermally conductive surfaces.

In embodiments, thermally conductive adhesive 404 can be applied, e.g., dispensed or stenciled, onto an area of either the heat sink surface 110 or the electronic device surface 308 that overlaps a perimeter of TIM pad 412, as depicted in view 450. As an example, certain thermally conductive adhesives 404 can be stenciled to a thickness of up to 300 μm onto a surface. View 450 depicts thermally conductive adhesive 404 prior to an assembly process. Thermally conductive adhesive 404 can be applied to either surface 110 or 308, for example, as one or more rectangular shapes, dots, or a contiguous line that overlap(s) the outer edge of TIM pad 412, as depicted in view 450. According to embodiments, the TIM pad 412 at least partially overlaps the formable thermally conductive adhesive 404 when the heat-producing electronic device 314, TIM pad 412 and heat sink 116 are assembled. In embodiments, compressive force applied to the assembly can cause thermally conductive adhesive 404 to fill gap regions 428, as depicted in view 400. Filling gap regions 428 can be useful for enhancing the overall conductivity of a thermal interface by filling gaps having shapes or thicknesses which cannot be effectively filled by TIM pad 412. Such a relatively thin layer of thermally conductive adhesive 404 can have a lower tendency to reflow, when heated, than a thicker layer that might be used in thermal interfaces not including a TIM pad 412. View 400 depicts thermally conductive adhesive 404 pressed into and filling gap regions 428 between TIM pad 412 and heat sink surface 110, however, in some embodiments, thermally conductive adhesive 404 can be used to fill similar gap regions between TIM pad 412 and electronic device surface 308.

In embodiments, thermally conductive adhesive 404 can be useful in preventing possible damage to the TIM pad 412 by holding or tacking a TIM pad 412 in an aligned position adjacent to the heat sink surface 110 or electronic device surface 308, for the duration of the assembly process. Such tacking can also be useful in avoiding the need for TIM alignment pins, which can increase thermal interface cost and complexity, and can consume critical hardware real estate on a PCB.

The use of two thermal interface materials each with unique, beneficial properties, e.g., thermally conductive adhesive 404 and TIM pad 412, in a stacked combination can provide a reliable, stable and efficient thermal interface between a heat-producing electronic device and a heat sink. Embodiments can also provide enhanced thermal conductivity, compared to other thermal interface implementations, through the use of a TIM pad in conjunction with a relatively thin layer of thermally conductive adhesive. Thermally conducting gap-filling adhesive materials can be useful at thermal interface peripheral locations and/or corners to provide mechanical damping to enhance TIM interface integrity during shock and vibration events that can occur during product handling or shipment.

In some applications, during the operating life of the heat-producing electronic device 314, a heatsink, e.g., 116, thermally conductive adhesive 404 and/or TIM pad 412 may need to be replaced or reattached to a heat-producing electronic device 314, through a rework process. According to embodiments, certain types of thermally conductive adhesive 404 can be removable, which can allow the assembly including heat sink 116 and heat-producing electronic device 314 to be reworked, repaired or replaced.

Certain types of thermally conductive adhesive 404 can shrink during curing process, which can provide a tensile force "F" between the heat sink surface 110 and the electronic device surface 308 in addition to a tensile force provided the adhesive prior to a curing process. Tensile force "F" can serve to pull the heat producing electronic device 314 and the heat sink 116 towards each other, which can result in compression of TIM pad 412 that reduces the TIM pad 412 thickness. The resulting compression can also be useful in forcing thermally conductive adhesive 404 into gap regions 428, view 400, from area(s) where thermally conductive adhesive 404 is initially dispensed, as depicted in view 450. Reduction of the thickness of TIM pad 412 can shorten the heat conduction path length through the TIM pad 412, which can lower the thermal resistance of the TIM pad 412 and the thermal resistance of the entire thermal interface. The insertion of thermally conductive adhesive 404 into gap regions can also be useful for lowering the thermal resistance of the entire thermal interface. Lowering thermal resistances can result in increased efficiency and effectiveness of thermal interface between TIM pad 412 and the electronic device surface 308 and heat sink surface 110. In some embodiments, for example, the overall thermal resistance of a hybrid TIM and thermally conductive adhesive material 404 can be 0.2° C.-in$^2$/W, which is a significant 80% reduction over the thermal resistance of double-sided thermally conductive tape by itself.

Figure 5:
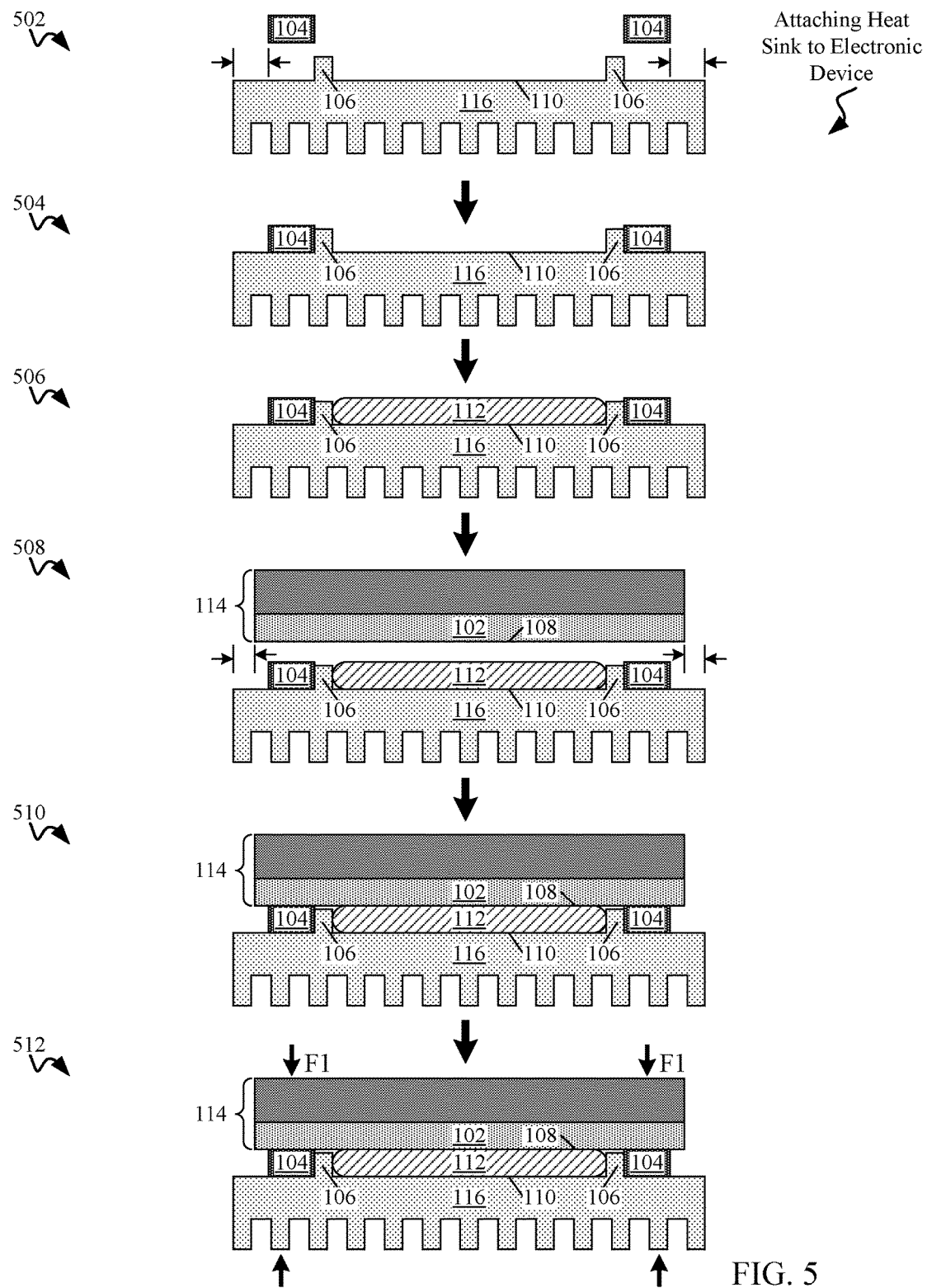
FIG. 5 includes a set of six consistent cross-sectional views illustrating the results of process operations for attaching a heat sink to an electronic device, according to embodiments consistent with the figures.
Figure 6:
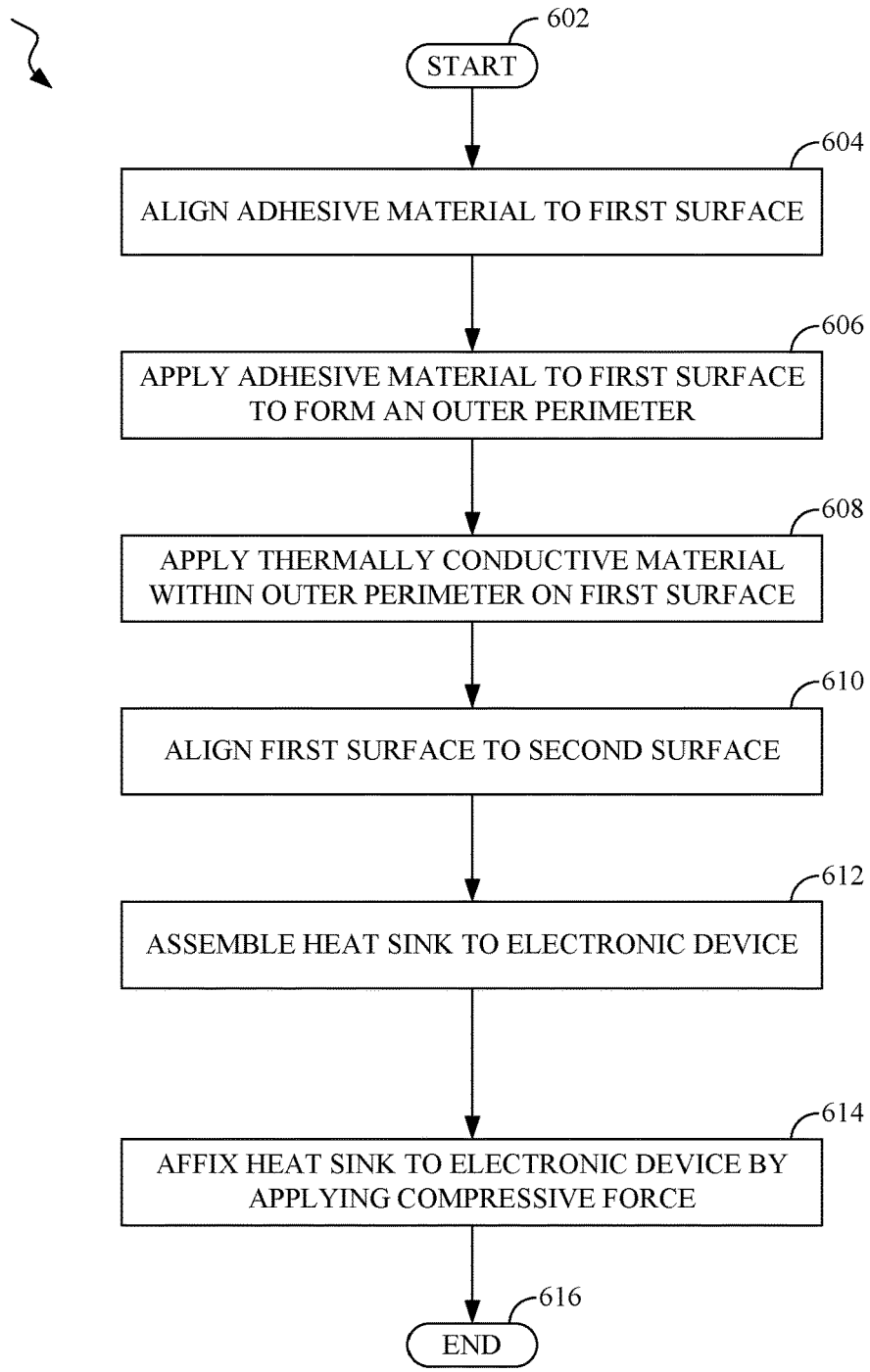
FIG. 6 is a flow diagram depicting a method for attaching a heat sink to an electronic device, according to embodiments consistent with the figures.

FIG. 5 includes a set of six consistent cross-sectional views 502-512 illustrating the results of process operations for attaching a heat sink to a heat-producing electronic device, according to embodiments consistent with the figures, particularly FIG. 6.

Views 502-512 illustrate an example process; other views and operations can be possible. A thermal interface structure formed by these process operations can be consistent with the cooling apparatuses depicted in FIG. 1-FIG. 4, and can provide an efficient thermal path between a heat-producing electronic device and a heat sink. The process operations depicted in FIG. 5 can be used to assemble a cooling apparatus that does not require mechanical fasteners to hold the heat sink 116 onto the heat-producing electronic device 114. Such an apparatus can be useful in PCB designs having limited space available for cooling devices such as heat sinks.

The progression depicted in views 502-512 begins with a heat sink 116 and a adhesive material 104, view 502, and ends with an assembly including heat-producing electronic device 114, thermally conductive material 112, adhesive material 104 and heat sink 116 in view 512. Assembly operations can be completed using commercially available materials which can be presently used for thermal interface construction, such as thermally conductive material 112 and adhesive material 104. A thermal interface fabricated using these process operations can be a particularly useful assembly when incorporated within a high-performance computing device or system.

The results of one or more process operations may be depicted in each view. For example, a view can depict the results of a material application process, which can include the application of both a tacking adhesive material and a TIM pad. Assembly operations associated with views 502-512 can include, but are not limited to material alignment, material application, component assembly and affixing operations. For ease of discussion, the views 502-512 depict an adhesive material 104, a thermally conductive material 112 and a heat-producing electronic device 114 aligned with and assembled onto a heat sink 116. However, it can be understood that in some embodiments the adhesive material 104, thermally conductive material 112, and heat sink 116 can be aligned with and assembled onto heat-producing electronic device 114.

Completed structures may be generally shown in views 502-512 as having rectangular cross-sectional profiles, with surfaces orthogonal to each other. This depiction, however, is not limiting; structures can be of any suitable shape, size and profile, in accordance with specific design criteria, manufacturing process limitations and available material profiles for a given application. For example, corners shown as having right angles can be rounded, surfaces can have a non-orthogonal relative orientation, and relative dimensional ratios can vary from those depicted in the figures.

The views 502-512 can be useful in illustrating details involved in assembling a thermal interface that has enhanced thermal conductivity relative to other types of thermal interface structures, while not requiring the use of external latching hardware to hold a heat sink to a heat-producing electronic device.

View 502 depicts a heat sink 116 and an adhesive material 104 aligned with edges of the heat sink 116. In some embodiments heat sink 116 includes a protrusion 106 extending away from the substantially planar heat sink surface 110 and some embodiments, heat sink 116 has a substantially planar heat sink surface 110 that does not include a protrusion 106. Protrusion 106 can be useful for containing a thermally conductive material or TIM pad within a perimeter formed by protrusion 106. According to embodiments, heat sink 116 can include types of heat dissipation devices which can be cooled by dissipating heat into air, refrigerant, water or other fluids. Adhesive material 104 can include commercially available adhesives such as double-sided adhesive tapes, adhesive material sheets, adhesive liquids, gels, and adhesives in aerosol formulations. According to embodiments, adhesive material 104 can have a thickness in a range between 0.05 mm and 1.0 mm. In some embodiments, adhesive material 104 can be thermally conductive, and useful as a supplemental heat conduction path between the heat sink 116 and a heat-producing electronic device 114.

View 504 depicts the results of applying the adhesive material 104 to the heat sink surface. According to embodiments, adhesive material 104 can be a PSA that can be applied to the heat sink surface 110 in a "ring" shape, which can be useful for containing thermally conductive material 112. Adhesive material 104 can be applied by processes including, but not limited to printing, stenciling, dispensing, e.g., through a syringe or nozzle, or through an aerosol spray. In some embodiments, adhesive material 104 can be applied in a region that overlaps at least one outer edge of a TIM pad, which can be useful in filling gaps between the TIM pad and at least one of the heat sink surface 110 and the electronic device surface 108. In some embodiments, adhesive material 104 can be useful for, in a subsequent operation, holding or tacking a TIM pad in place during the attachment of the heat sink 116 to the heat-producing electronic device 114. Such tacking can be useful in preventing damage to a fragile TIM pad during the attachment.

View 506 depicts the results of applying the thermally conductive material 112 to the heat sink surface 110. According to embodiments, thermally conductive material 112 can be thermal greases, pastes, gels, curable gels and binders with metal particulates. In some embodiments, a TIM pad, which can include materials such as indium, silver, carbon fiber or various silicone formulations, can be applied either alone or in combination with thermally conductive material 112. In some embodiments, a tacking adhesive material such as transient evaporative materials, e.g., isopropyl alcohol, or thermally conductive materials and/or adhesives such as thermal greases, pastes or gels, can be applied before applying the TIM pad, in order to hold the TIM pad in place during the assembly process. Application of thermally conductive material 112 and/or a TIM pad can be useful in filling gaps between the heat sink 112 and the heat-producing electronic device 114, thereby providing an enhanced thermal interface.

View 508 depicts a heat-producing electronic device 114 aligned with the heat sink 116. Alignment of heat-producing electronic device 114 with heat sink 116 can be useful for ensuring that thermally conductive material 112 is positioned to maintain thermally conductive contact with particular high thermal output areas of heat-producing electronic device 114, to provide efficient heat transfer. In some embodiments, heat-producing electronic device 114 can include a lid 102, in thermally conductive contact with heat-producing elements, such as ICs, within heat-producing electronic device 114. In some embodiments, heat-producing electronic device 114 may not include a lid 102; in such embodiments electronic device surface 108 may include the backside of one or more IC die.

View 510 depicts the results of assembling the heat-producing electronic device 114 to the heat sink 116. According to embodiments, electronic device surface 108 of heat-producing electronic device 114 is brought into contact with a surface of adhesive material 104. As a result of this process, thermally conductive material 112 is brought into contact with electronic device surface 108, which is useful for establishing an efficient thermally conductive path between the heat-producing electric device 114 and the heat sink 116. In some embodiments, thermally conductive material 112 can also include a TIM pad, possibly in conjunction with thermally conductive material 112.

View 512 depicts the results of affixing the heat-producing electronic device 114 to the heat sink 116. According to embodiments, the heat-producing electronic device 114 may be affixed to the heat sink 116 by applying a specified compressive force "F1" to the assembly of the heat-producing electronic device 114 and the heat sink 116 for a specified time. Such a specified compressive force may be useful in activating an adhesive material 104 that is pressure-sensitive. For example, certain PSAs can require an application pressure in a range between 5 psi and 20 psi, for several seconds in order to properly activate adhesion.

FIG. 6 is a flow diagram depicting a method 600 for attaching heat sink to a heat-producing electronic device, according to embodiments consistent with the figures, particularly FIG. 5. Method 600 is directed towards attaching heat sink to a heat-producing electronic device through the use of various combinations of thermally conductive and adhesive materials to achieve an efficient, highly conductive thermal interface without the use of mechanical latching or attachment hardware. Method 600 can be useful for creating, using commercially available materials, a robust, stable and reliable thermal interface particularly suitable for electronic devices having a high thermal output. Method 600 describes series of process operations used to complete the attachment of a heat sink to a heat-producing electronic device.

Operations depicted and described in FIG. 6 generally correspond to the set of process operations for attaching a heat sink to a heat-producing electronic device depicted in FIG. 5 and described in the associated text. The arrangement of operational blocks within the flow diagram 600 of FIG. 6 is not to be construed as limiting the order in which the individual operations may be performed, as certain embodiments may perform the operations of FIG. 6 in various alternative orders. For ease of discussion, the operations of method 600 are directed towards aligning and assembling an adhesive material, a thermally conductive material and a heat-producing electronic device onto a heat sink. However, it can be understood that in some embodiments the adhesive material, thermally conductive material, and heat sink can be aligned with and assembled onto heat-producing electronic device.

The process 600 moves from start 602 to operation 604. Operation 604 generally refers to aligning an adhesive material to a heat sink. According to embodiments, aligning an adhesive material to a heat sink can be useful for ensuring that a thermally conductive material contained within a perimeter formed by adhesive material maintains contact with a specified area of a heat-producing electronic device. Such a specified area can correspond to particularly high thermal output devices such as processors or GPUs. In embodiments, the operation of aligning the adhesive material with the heat sink can be performed manually or through the use of automated/precision machinery incorporating optical or other types of positioning sensors. Once the adhesive material is aligned, the process moves to operation 606.

Operation 606 generally refers to applying the adhesive material to a surface of the heat sink. According to embodiments, the adhesive material can be useful, when applied in a "ring" shape to the heat sink surface, for containing thermally conductive material and/or TIM pad in a specified location. Such containment can provide an optimized, efficient cooling path for the heat-producing electronic device. In embodiments, the adhesive material can be a PSA. Once the adhesive material is applied, the process moves to operation 608.

Operation 608 generally refers to applying a thermally conductive material to the surface that the adhesive material is applied to. According to embodiments, thermally conductive material 112 can be applied through printing, stenciling, dispensing, e.g., through a syringe or nozzle. Thermally conductive material 112 can be useful for filling gaps between the heat sink 112 and the heat-producing electronic device 114, thereby providing an enhanced thermal interface. Once the thermally conductive material is applied, the process moves to operation 610.

Operation 610 generally refers to aligning the heat-producing electronic device to the heat sink. According to embodiments, alignment of the heat-producing electronic device with the heat sink can be useful for ensuring that thermally conductive material is positioned to maintain thermally conductive contact with particular areas of the heat heat-producing electronic device, in order to provide efficient heat transfer from the electronic device to the heat sink.

In embodiments, the operation of aligning the heat-producing electronic device 114 with heat sink 116 can be performed manually or through the use of automated/precision machinery incorporating optical or other types of positioning sensors. Once the heat-producing electronic device is aligned to the heat sink, the process moves to operation 612.

Operation 612 generally refers to assembling the heat sink to the heat-producing electronic device. According to embodiments, a portion of the surface of the heat-producing electronic device is brought into contact with the adhesive material while another portion of the heat-producing electronic device surface is brought into contact with the thermally conductive material. Establishing such contact is useful to cause adhesion between the adhesive material and the heat-producing electronic device and to establish an efficient, thermally conductive contact between the thermally conductive material and the electronic device. Once the heat sink is assembled to the heat-producing electronic device, the process moves to operation 614.

Operation 614 generally refers to the affixing the heat sink to the heat-producing electronic device. According to embodiments, the heat-producing electronic device may be affixed to the heat sink by applying a specified compressive force to the assembly of the heat-producing electronic device and the heat sink for a specified time. Such a specified compressive force may be useful in activating an adhesive material that is pressure-sensitive. Both the magnitude and time duration of the compressive force may be monitored and controlled manually or through the use of automated equipment. Once heat sink is affixed to the heat-producing electronic device, the process 600 may end at block 616.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method for attaching a heat sink to a heat-producing electronic device, one of the heat sink and the heat-producing electronic device having a first surface, the other of the heat sink and the heat-producing electronic device having a second surface, the heat sink including a protrusion extending away from the heat sink, the method comprising:
   aligning an adhesive material to the first surface;
   applying the adhesive material to the first surface to form an outer perimeter;
   applying, within the outer perimeter, a thermally conductive material to the first surface, the thermally conductive material contained within spatial confines defined by the outer perimeter, the first surface, and the second surface;
   aligning the second surface to the first surface;
   assembling the heat sink to the heat-producing electronic device by bringing the second surface into contact with the adhesive material; and
   affixing the heat sink to the heat-producing electronic device by applying a compressive force to the heat sink and to the heat-producing electronic device, the compressive force activating the adhesive material.

2. The method of claim 1, wherein the adhesive material is a pressure-sensitive adhesive (PSA) selected from the group consisting of a double-sided adhesive tape, an adhesive material sheet, an adhesive gel, a curable adhesive and an aerosol adhesive.

3. The method of claim 1, wherein the applying of the thermally conductive material to the first surface includes applying a thermal interface material (TIM) pad to the first surface.

4. The method of claim 1, wherein the applying of the thermally conductive material to the first surface includes an application, to the first surface, of a tacking material configured to hold a thermal interface material (TIM) pad adjacent to the first surface during assembly of the heat sink to the heat-producing electronic device.

5. The method of claim 1, wherein the adhesive material holds a thermal interface material (TIM) pad adjacent to at least one of the first surface and the second surface.

6. The method of claim 5, wherein the adhesive material is thermally conductive and fills at least one gap between the TIM pad and the at least one of the first surface and the second surface to which the TIM pad is held adjacent.

7. The method of claim 1, wherein the applying of a thermally conductive material to the first surface includes an application of a formable thermal conductive material selected from the group consisting of a thermal grease, a thermal paste, a thermal gel and a phase-change material.

8. The method of claim 1, wherein the affixing of the heat sink to the heat-producing electronic device includes an adhesive material curing process.

9. The method of claim 8, wherein the adhesive material curing process causes a contraction of the adhesive material, the contraction providing a tensile force between the first surface and the second surface.

10. The method of claim 1, wherein, once activated, the adhesive material holds the first surface in an adjacent, coplanar orientation to the second surface such that an outer cavity is formed, wherein the outer cavity is bounded by the outer perimeter, the first surface and the second surface, wherein a thermally conductive material is contained in an inner cavity enclosed within the outer cavity, the inner cavity bounded by an inner perimeter, the first surface and the second surface, and wherein the thermally conductive material is configured to cool the heat-producing electronic device by providing a thermally conductive path between the first surface and the second surface.

11. The method of claim 10, wherein the first surface has a protrusion extending away from the first surface, the protrusion defining the inner perimeter on the first surface.

12. The method of claim 11, wherein a first height of the protrusion, extending away from the first surface, is in a range between 40% and 90% of a second height of the adhesive material.

13. The method of claim 11, wherein an outline of the adhesive material defines a vent formed between the inner perimeter and an exterior perimeter of the adhesive material.

14. The method of claim 1, wherein a first height of the protrusion, extending away from the heat sink, is in a range between 40% and 90% of a second height of the adhesive material.

15. The method of claim 1, wherein a first height of the protrusion, extending away from the heat sink, is less than a distance, in an assembled configuration, between the first surface and the second surface.

16. The method of claim 1, wherein the adhesive material is thermally conductive and configured to transfer heat between the second surface and the first surface.

17. The method of claim 1, wherein the adhesive material is chemically inert with respect to the thermally conductive material.

18. The method of claim 1, wherein an outline of the adhesive material defines a vent formed between the spatial confines defined by the outer perimeter and an exterior perimeter of the adhesive material.

19. The method of claim 1, wherein a thermally conductive material is positioned, in an unassembled configuration, at a perimeter of a thermal interface material (TIM) pad, the TIM pad located within the spatial confines defined by the outer perimeter, the first surface, and the second surface, the thermally conductive material positioned, in an assembled configuration, between the TIM pad and at least one of a portion of the first surface and a portion of the second surface.

20. The method of claim 19, wherein the adhesive material is thermally conductive and is positioned, in the assembled configuration, between the TIM pad and at least one of a portion of the first surface and a portion of the second surface.

* * * * *